(12) United States Patent
Tanifuji

(10) Patent No.: US 11,353,323 B1
(45) Date of Patent: Jun. 7, 2022

(54) COMPUTER READABLE STORAGE MEDIUM STORING MULTILAYER FLUID ANALYSIS PROGRAM, MULTILAYER FLUID ANALYSIS SYSTEM, AND MULTILAYER FLUID ANALYSIS METHOD

(71) Applicants: HASL Co., LTD., Tokyo (JP); ZHEJIANG JINGCHENG MOLD MACHINERY CO, LTD., Zhejiang (CN)

(72) Inventor: Shinichiro Tanifuji, Tokyo (JP)

(73) Assignees: HASL CO., LTD., Tokyo (JP); ZHEJIANG JINGCHENG MOLD MACHINERY CO, LTD., Zhejiang (CN)

( * ) Notice: Subject to any disclaimer, the term of this patent is extended or adjusted under 35 U.S.C. 154(b) by 0 days.

(21) Appl. No.: 17/584,806

(22) Filed: Jan. 26, 2022

(30) Foreign Application Priority Data

Feb. 10, 2021 (JP) .............................. JP2021-020279

(51) Int. Cl.
*G01B 13/06* (2006.01)
*G01D 7/08* (2006.01)
*G01N 11/02* (2006.01)

(52) U.S. Cl.
CPC .............. *G01B 13/06* (2013.01); *G01D 7/08* (2013.01); *G01N 11/02* (2013.01); *G01D 2207/30* (2021.05)

(58) Field of Classification Search
CPC ...... G01B 13/06; G01D 7/08; G01D 2207/30; G01N 11/02
See application file for complete search history.

(56) References Cited

U.S. PATENT DOCUMENTS

2021/0294947 A1* 9/2021 Tanifuji ................ G01N 11/00

FOREIGN PATENT DOCUMENTS

| JP | 2009-113406 A | 5/2009 |
|---|---|---|
| JP | 2010-280083 A | 12/2010 |
| JP | 6547157 B1 | 7/2019 |
| JP | 6908904 B1 | 7/2021 |

OTHER PUBLICATIONS

Apr. 27, 2021 Office Action issued in Japanese Patent Application No. 2021-020279.

* cited by examiner

*Primary Examiner* — David Z Huang
(74) *Attorney, Agent, or Firm* — Oliff PLC

(57) ABSTRACT

A computer-readable storage medium storing a multilayer fluid analysis program is provided for analyzing a multilayer fluid on a feed block type T-die as 2.5 dimensions in which each layer is divided into elements. The program causing a computer to execute: a layer thickness calculation process for calculating the layer thickness under a condition that stresses in a normal direction and a tangential direction equilibrate on an interface of each layer and a flow velocity on the interface is continuous, without considering a fluid flow in a thickness direction, considering a viscoelastic effect of a fluid to analyze an encapsulation phenomenon, and based on a shape of the feed block and a second normal stress difference of resin assuming that a layer thickness in a transverse direction fluctuates in a developmental state; and a display process of displaying a calculation result of the layer thickness calculation process.

6 Claims, 18 Drawing Sheets

[FIG.1]
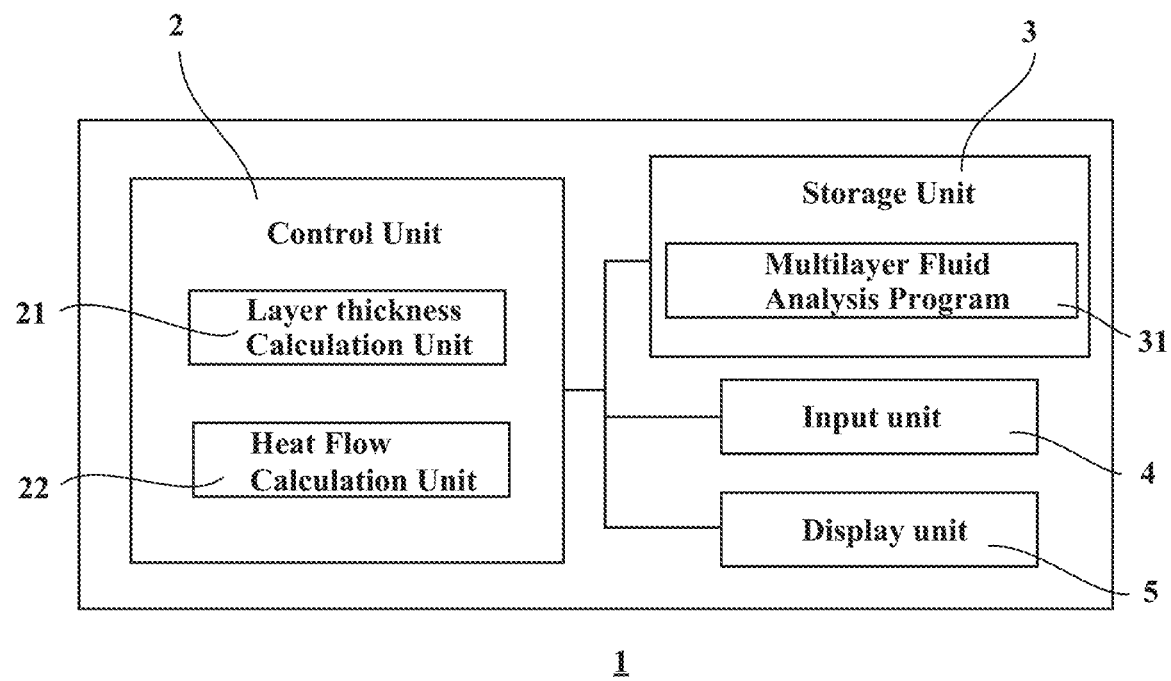

[FIG.2]
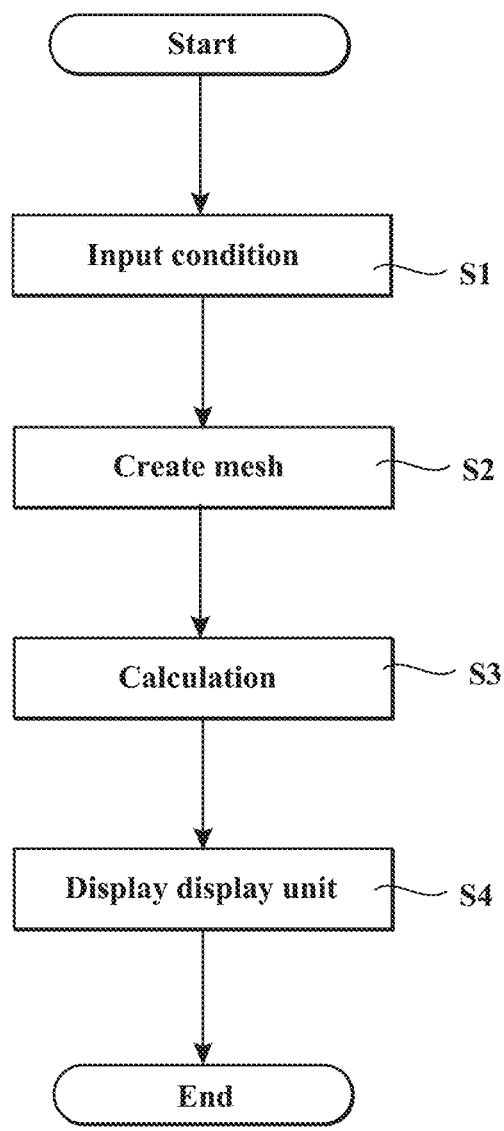

[FIG.3(a)]
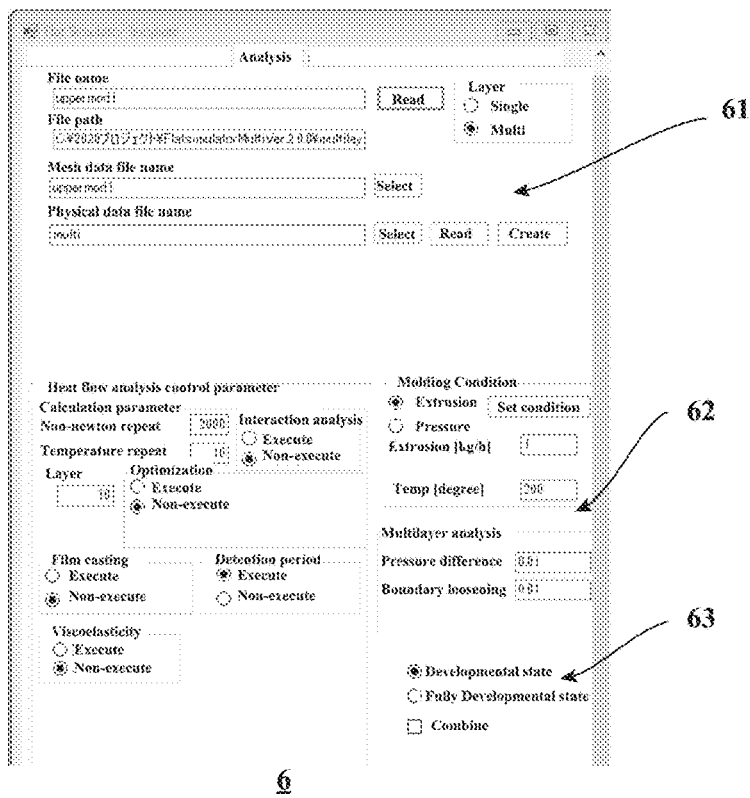
[FIG.3(b)]
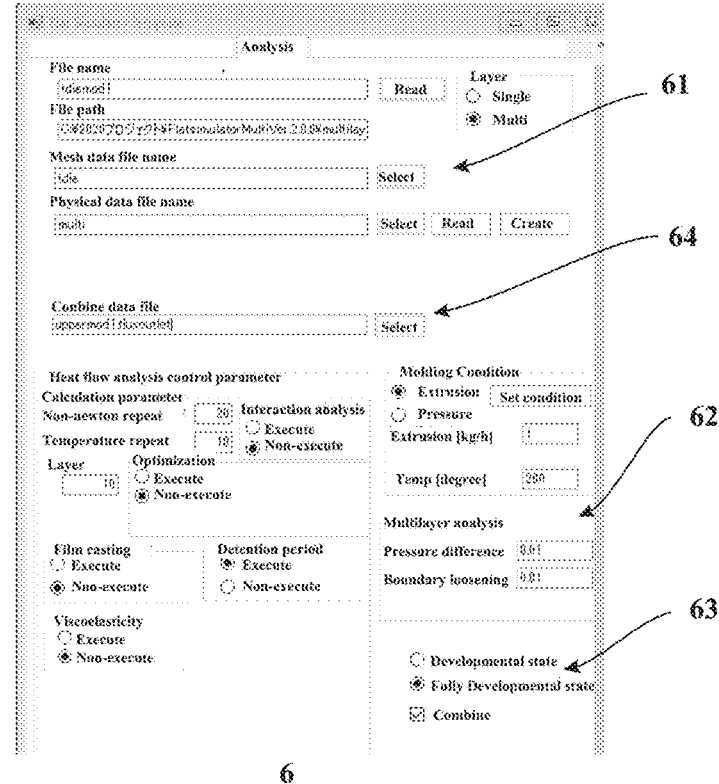

[FIG.4]
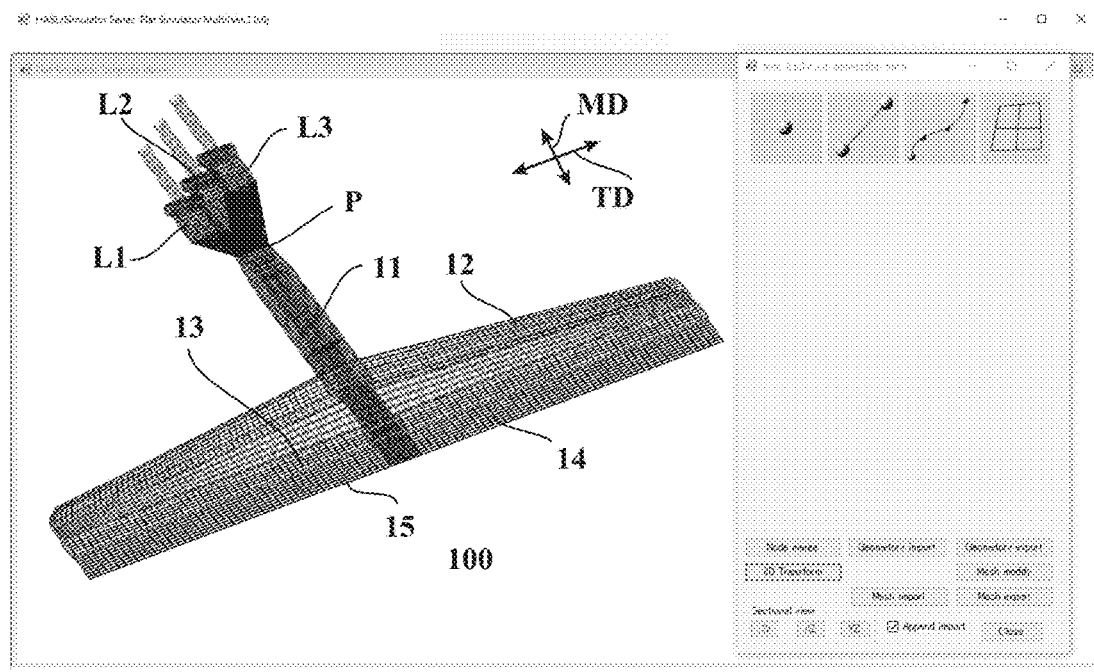
[FIG.5]
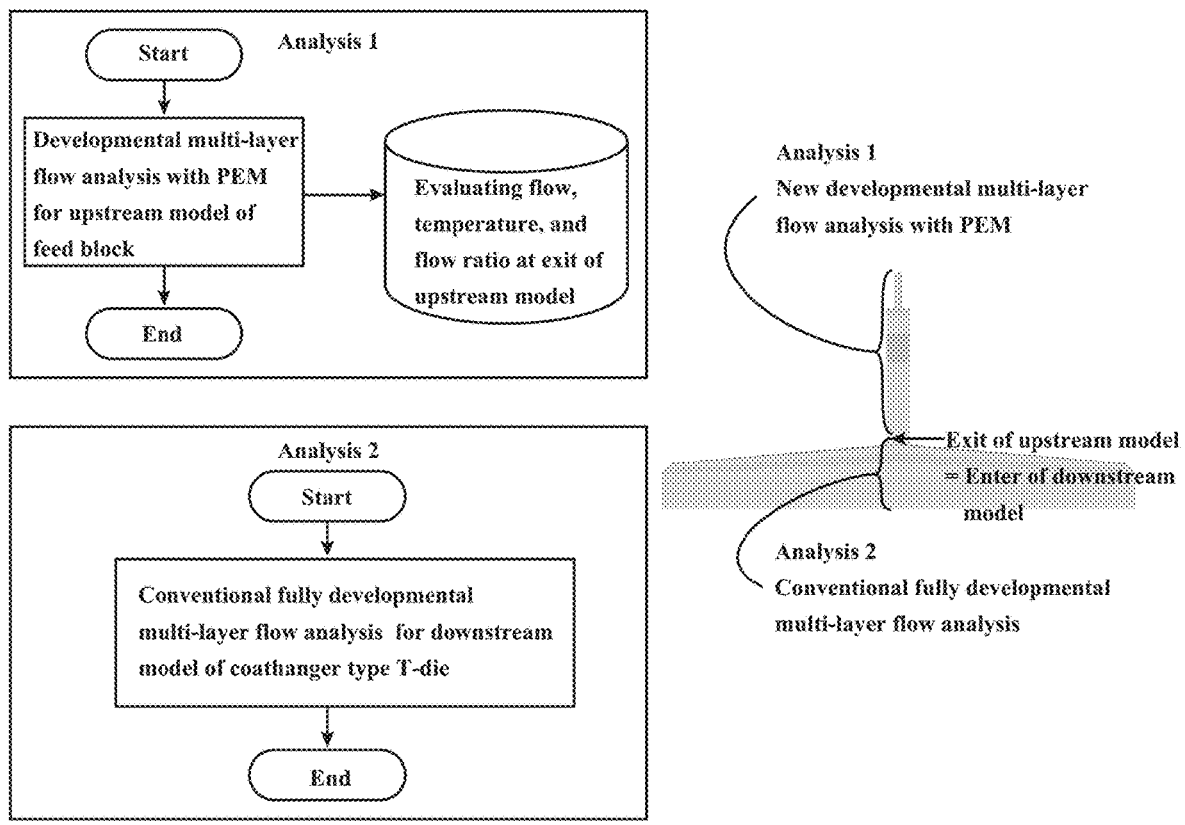

[FIG.6]
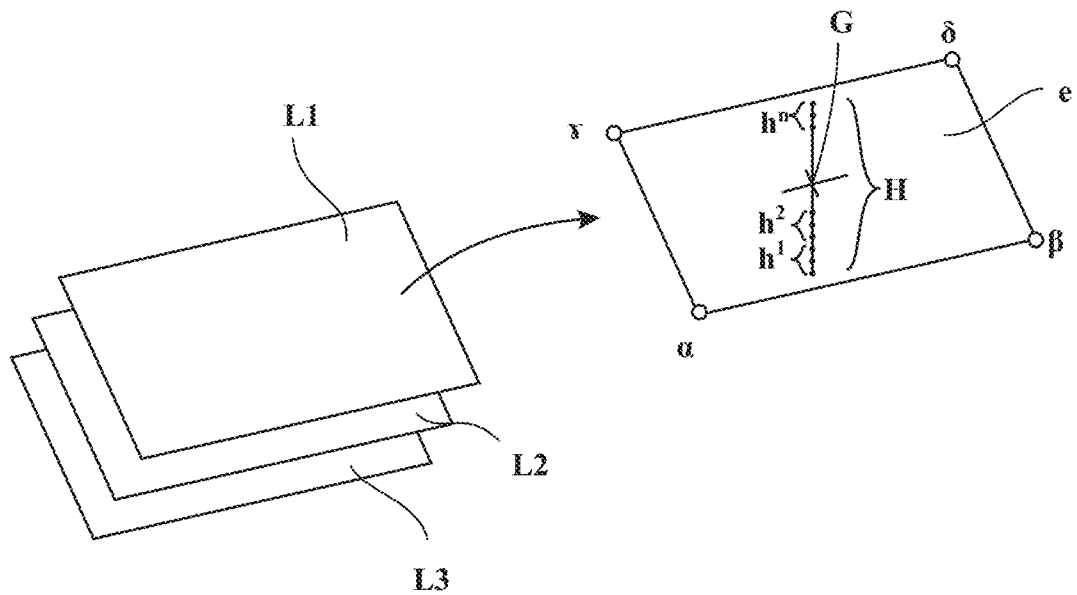
[FIG.7]
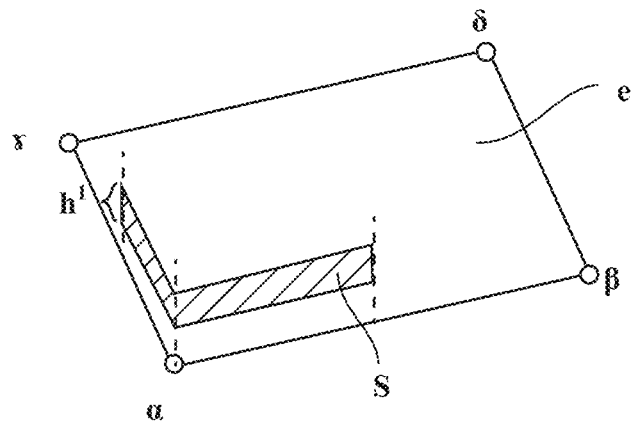

[FIG.8]
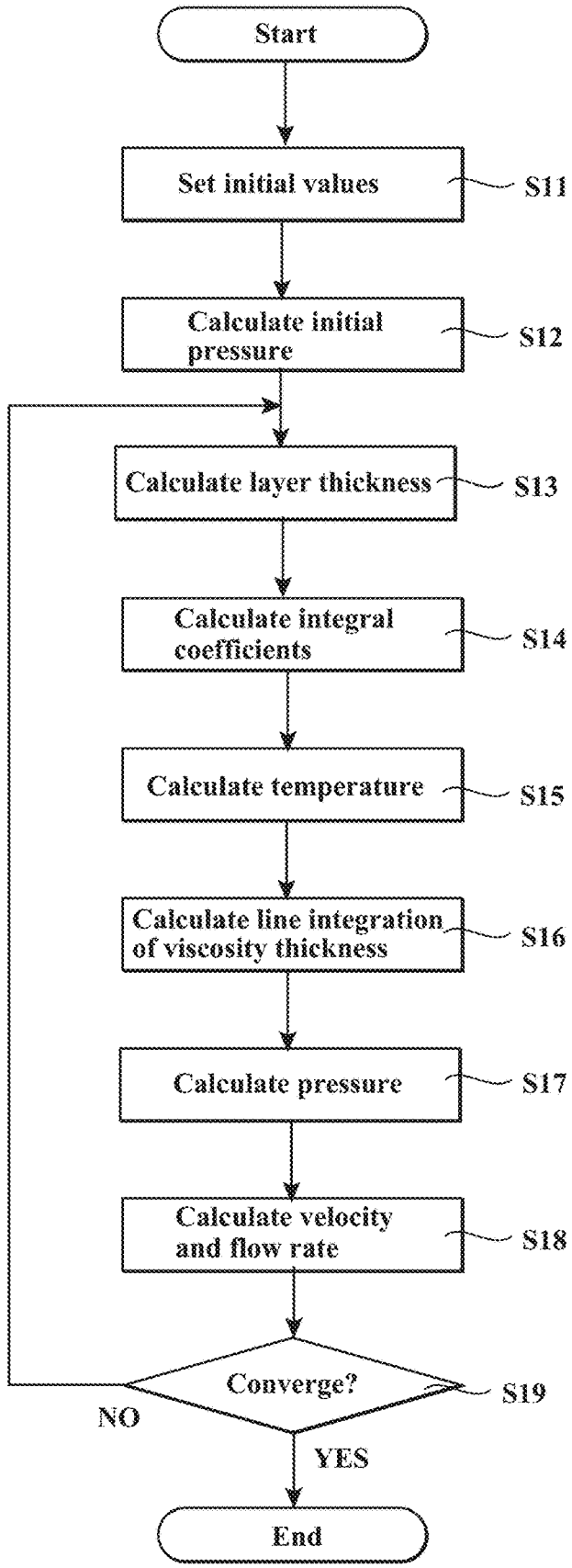

[FIG.9]
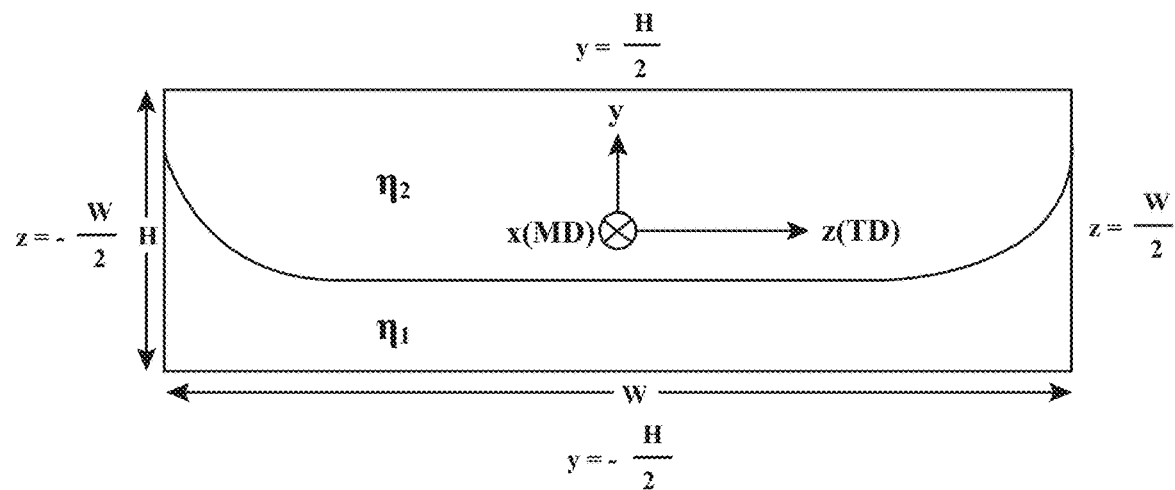
[FIG.10]
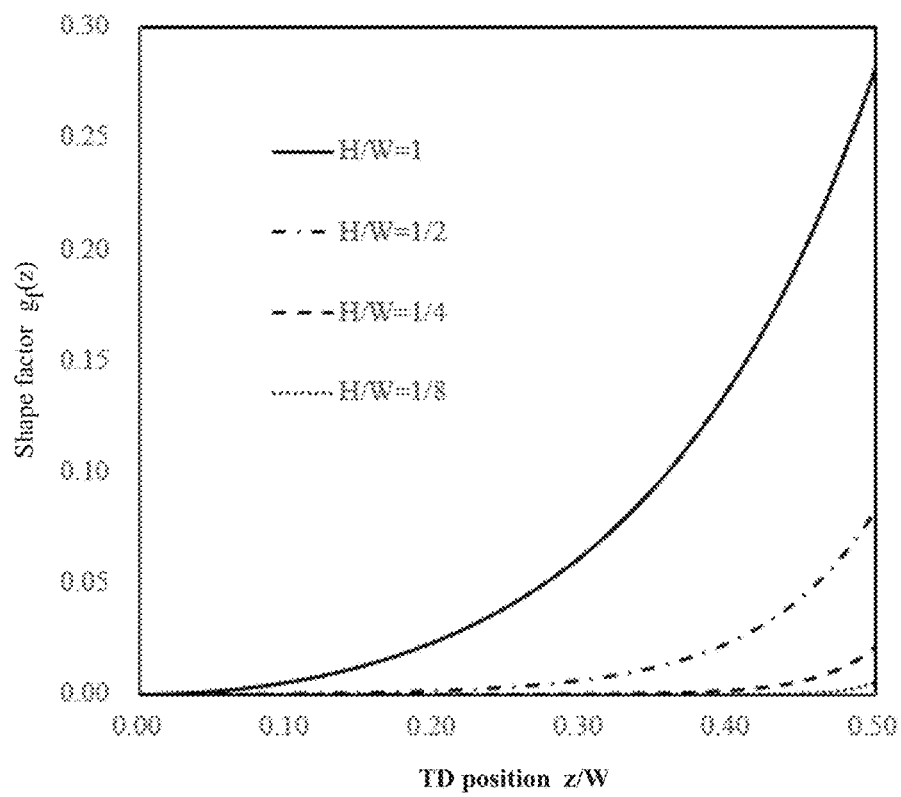

[FIG.11]
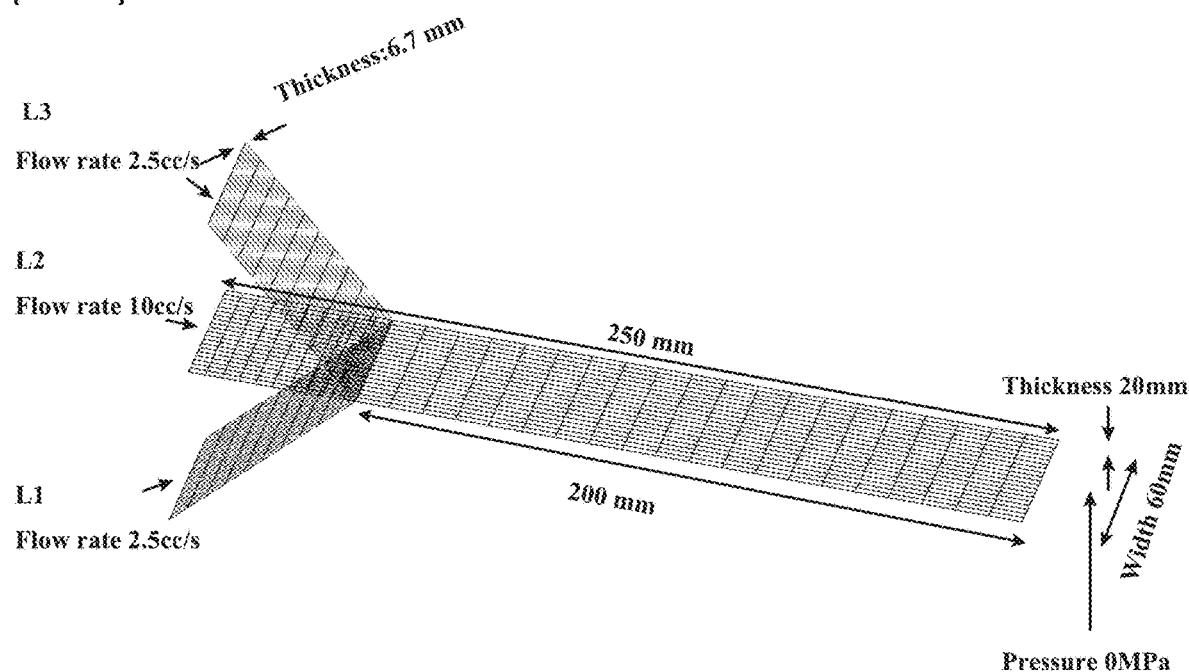
| case | Second normal stress difference coefficient $\Psi_2[Pa \cdot s^2]$ | | |
| --- | --- | --- | --- |
| | L1 | L2 | L3 |
| 1 | -5.6 | -10 | -5.6 |
| 2 | -0.5 | -10 | -0.5 |
| 3 | -2 | -10 | -4 |
Viscosity $\eta_1=\eta_3=1000$ $\eta_2=2000$ $[Pa \cdot S]$

[FIG.12]
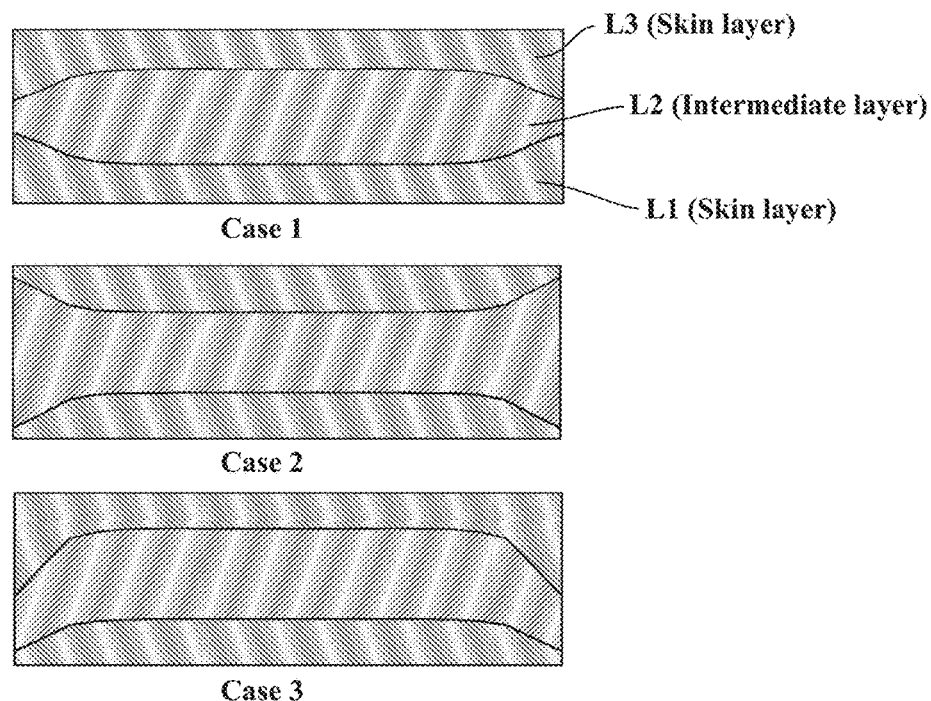
[FIG.13]
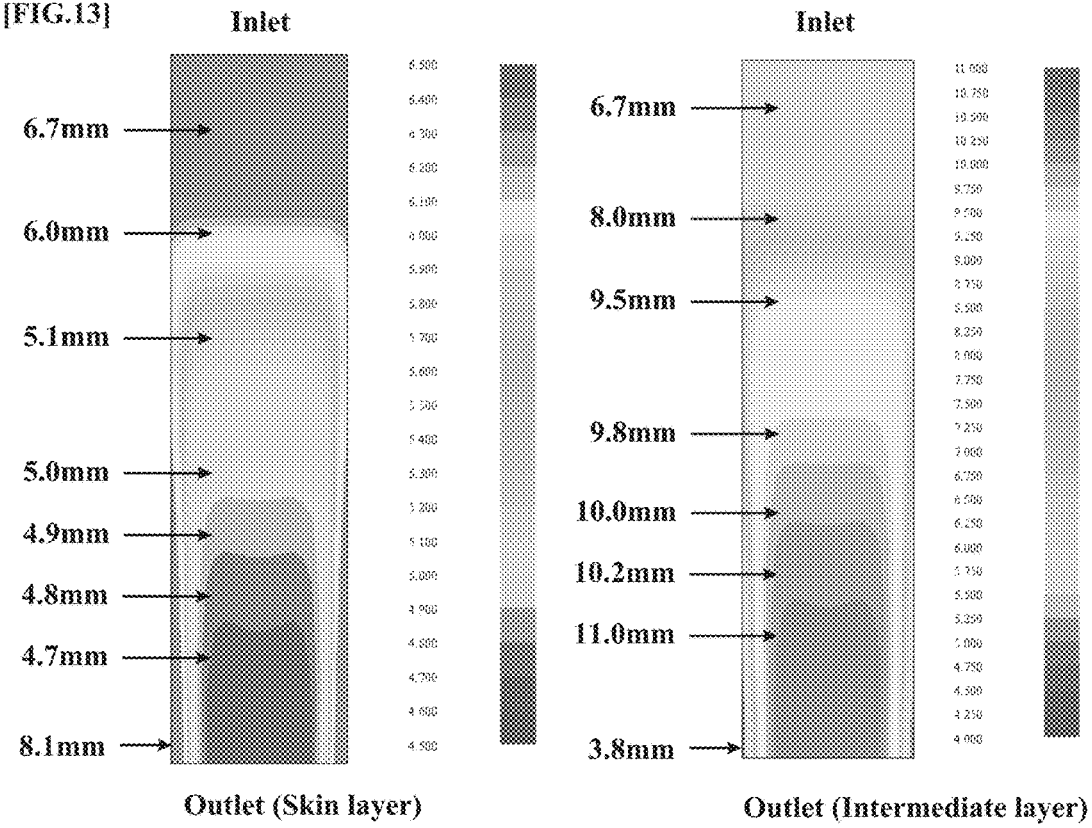

[FIG.14(a)]
[FIG.14(b)]
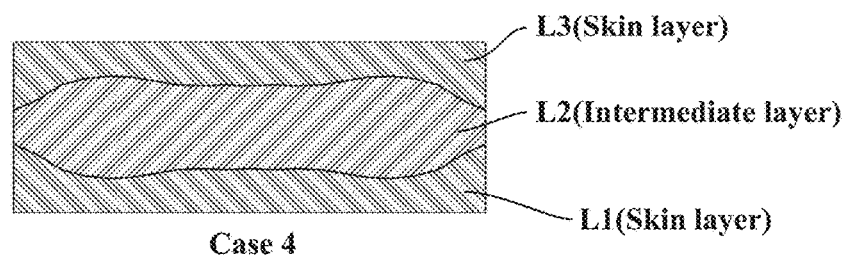
Case 4
[FIG.14(c)]
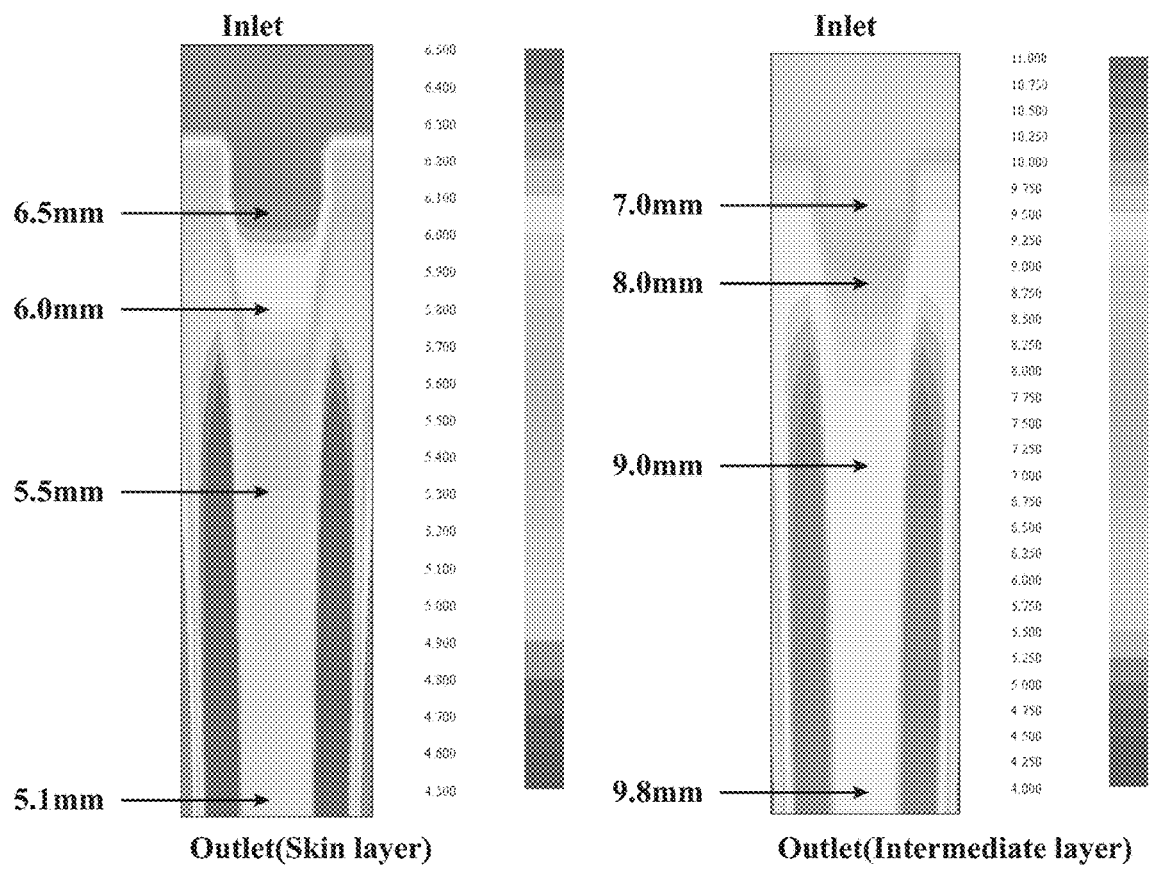

[FIG.15(a)]
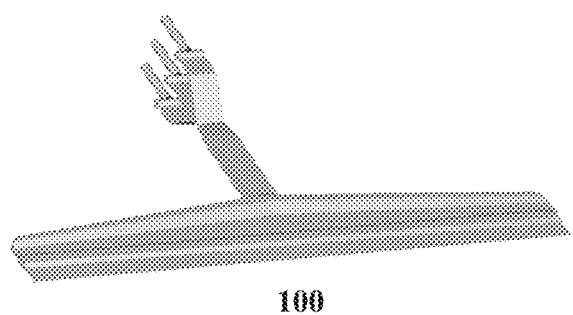
100
[FIG.15(b)]
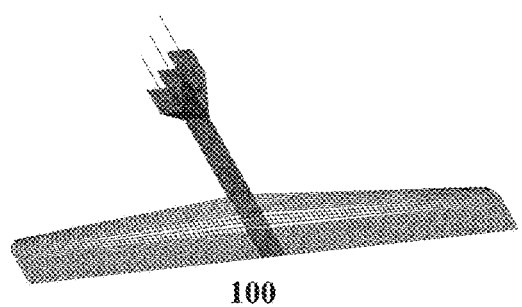
100
[FIG.15(c)]
P
100
[FIG.15(d)]
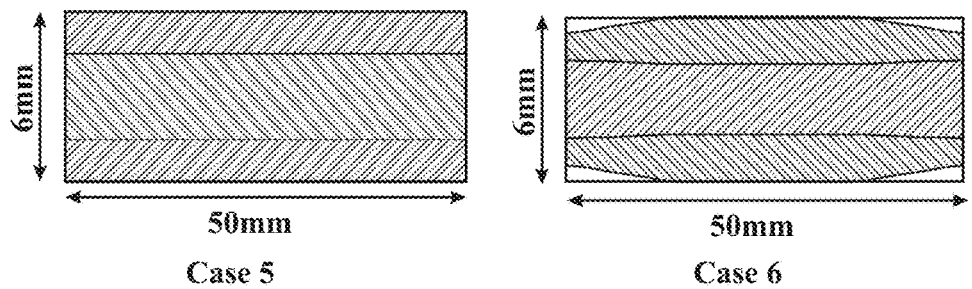
Case 5    Case 6
[FIG.15(e)]
|  | L1 | L2 | L3 |
|---|---|---|---|
| Extrusion amount [kg/h] | 4 | 16 | 4 |
| Viscosity [Pa·s] | 1000 | 2000 | 1000 |
| $\Psi_2$ [Pa·s$^2$] | -20 | -60 | -20 |
Density:777[kg/m³], Specific heat:2500[J/kg/K], Thermal conductivity:0.182[W/m/K]

[FIG.16(a)]
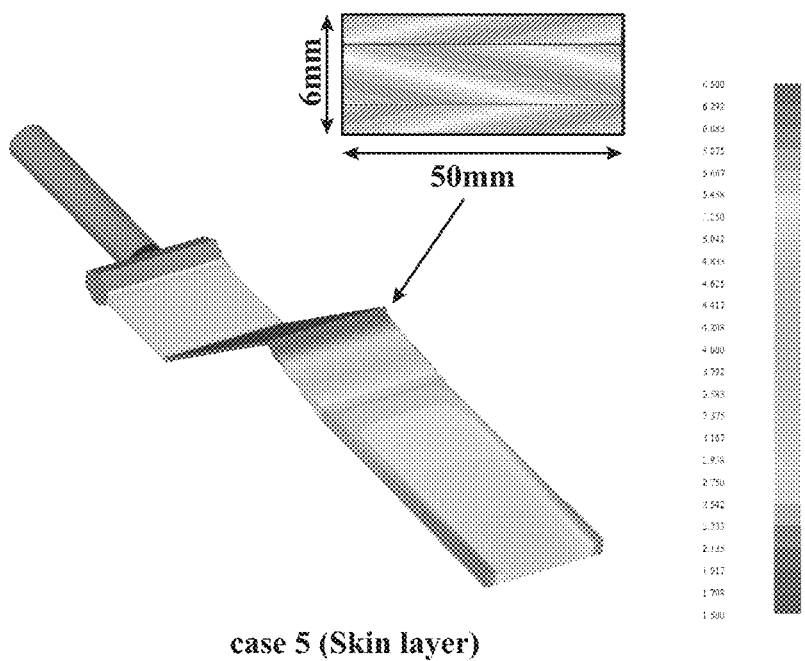
case 5 (Skin layer)
[FIG.16(b)]
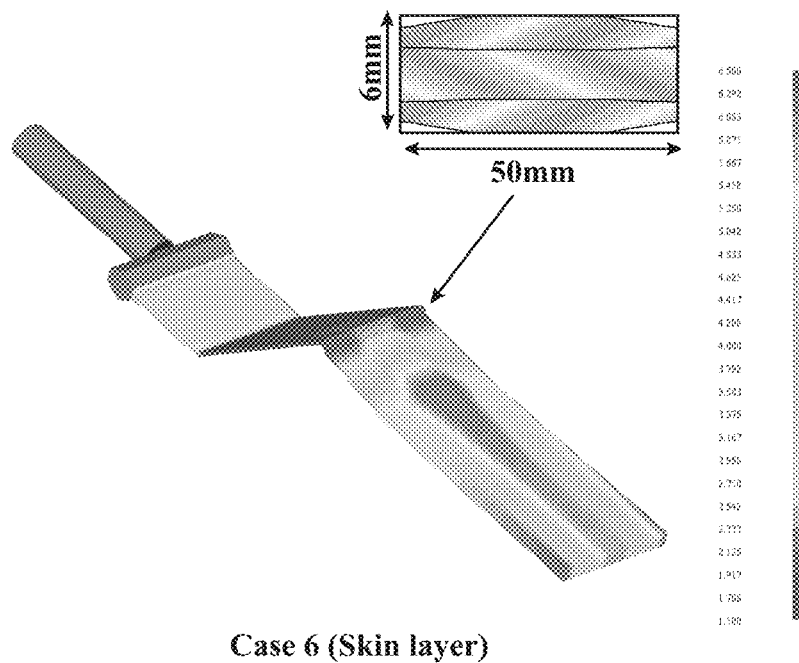
Case 6 (Skin layer)

[FIG.17(a)]
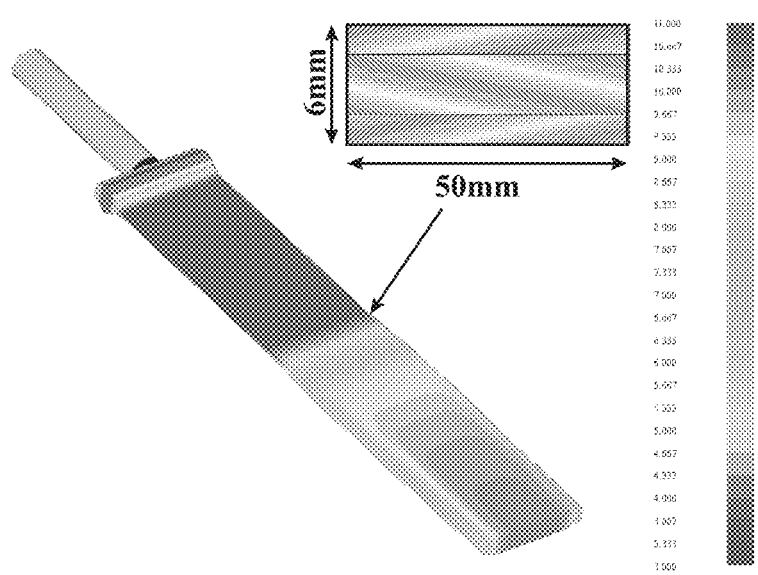
Case 5 (Intermediate layer)
[FIG.17(b)]
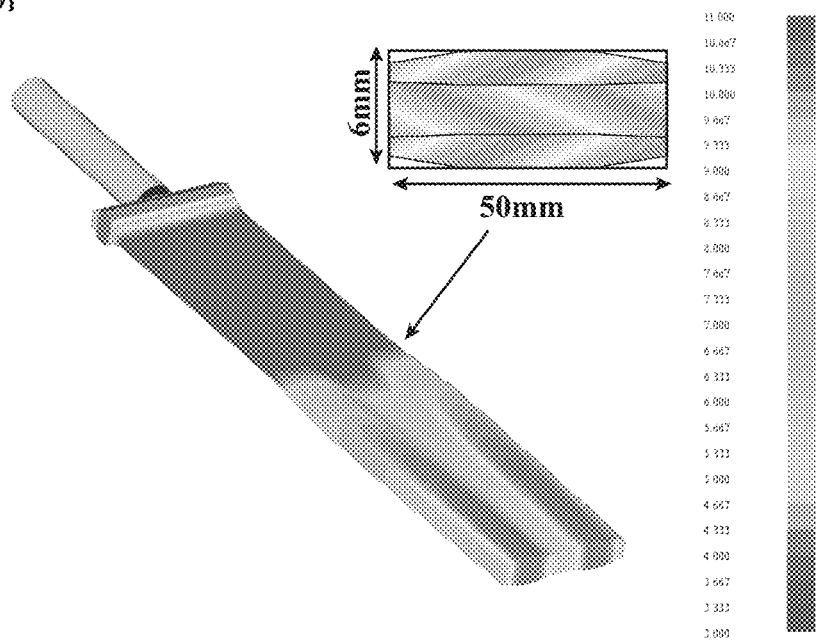
Case 6 (Intermediate layer)

[FIG.18]
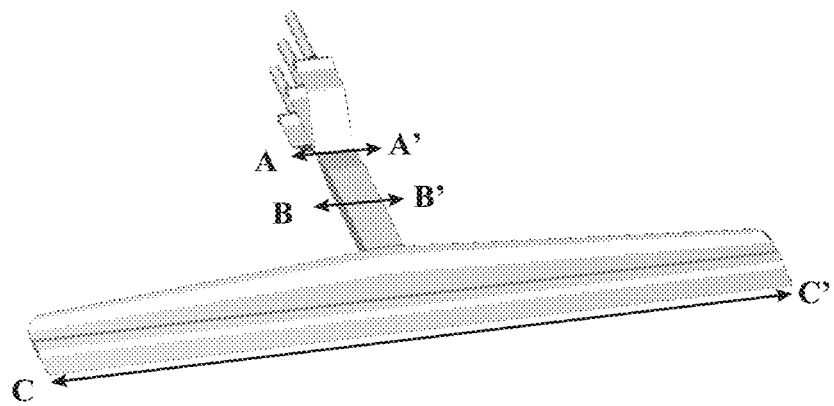
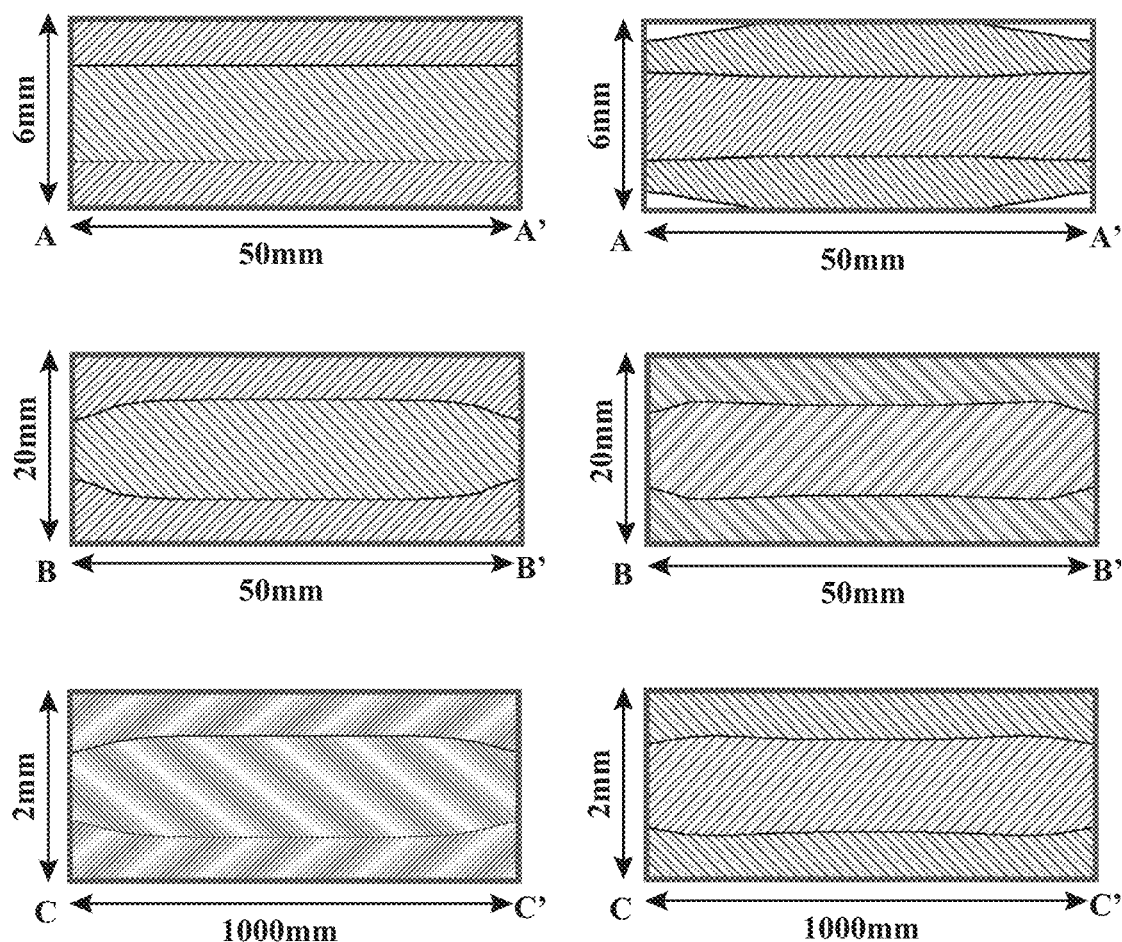
Case 5          Case 6

[FIG.19(a)]
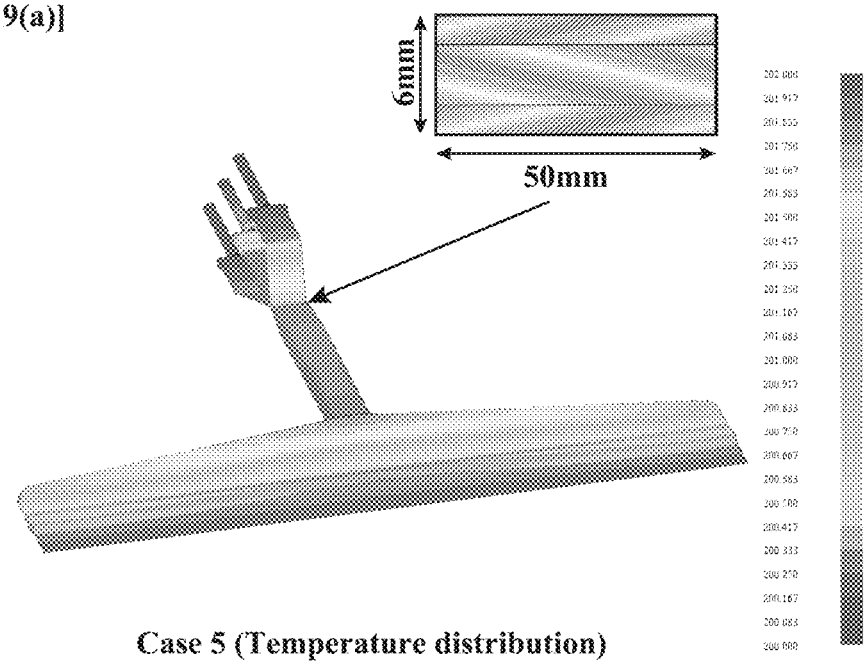
Case 5 (Temperature distribution)
[FIG.19(b)]
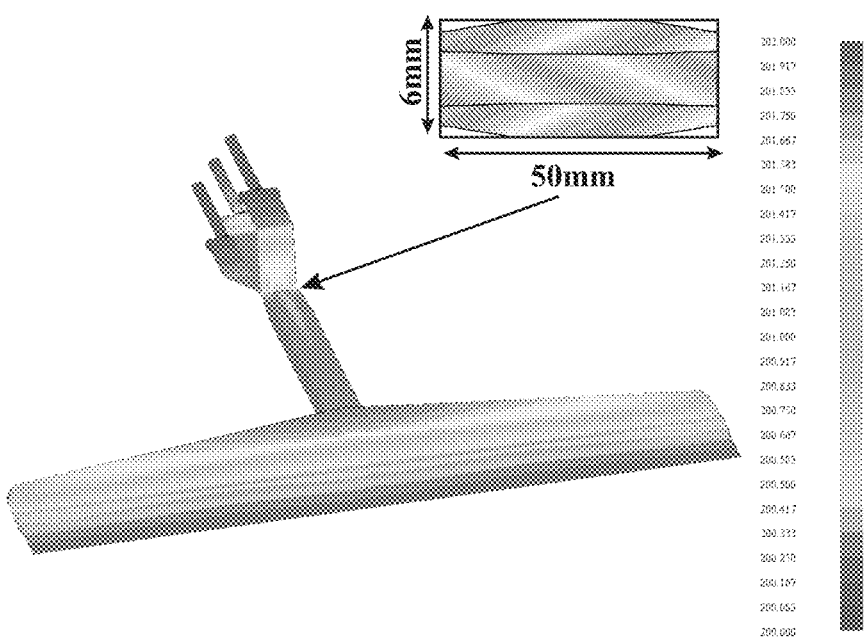
Case 6 (Temperature distribution)

[FIG.20(a)]
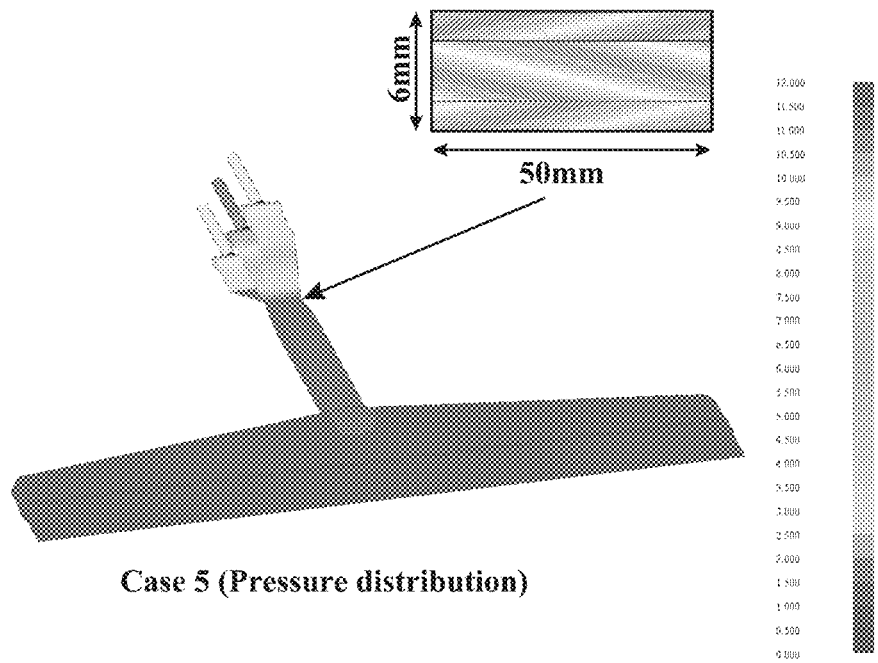
Case 5 (Pressure distribution)
[FIG.20(b)]
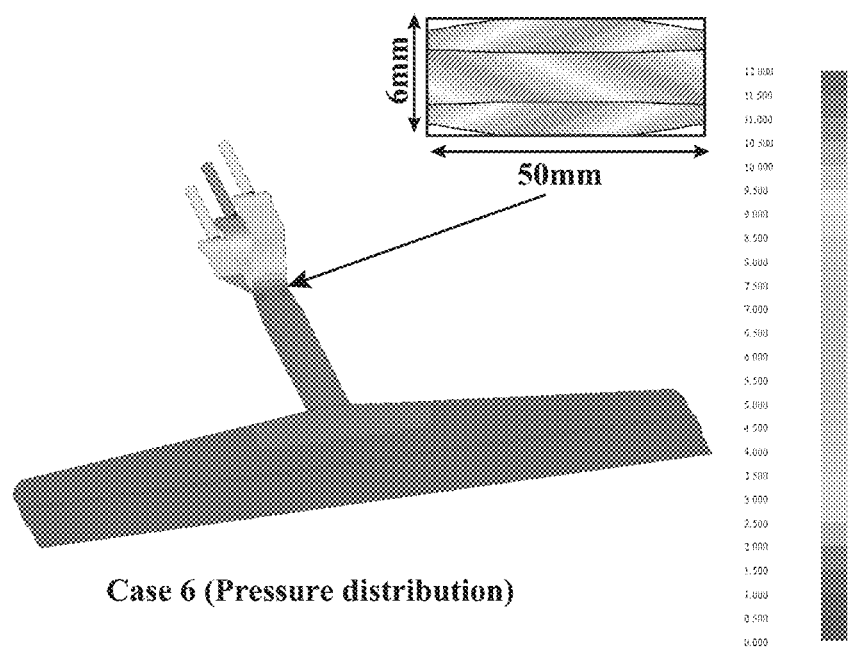
Case 6 (Pressure distribution)

[FIG.21(a)]
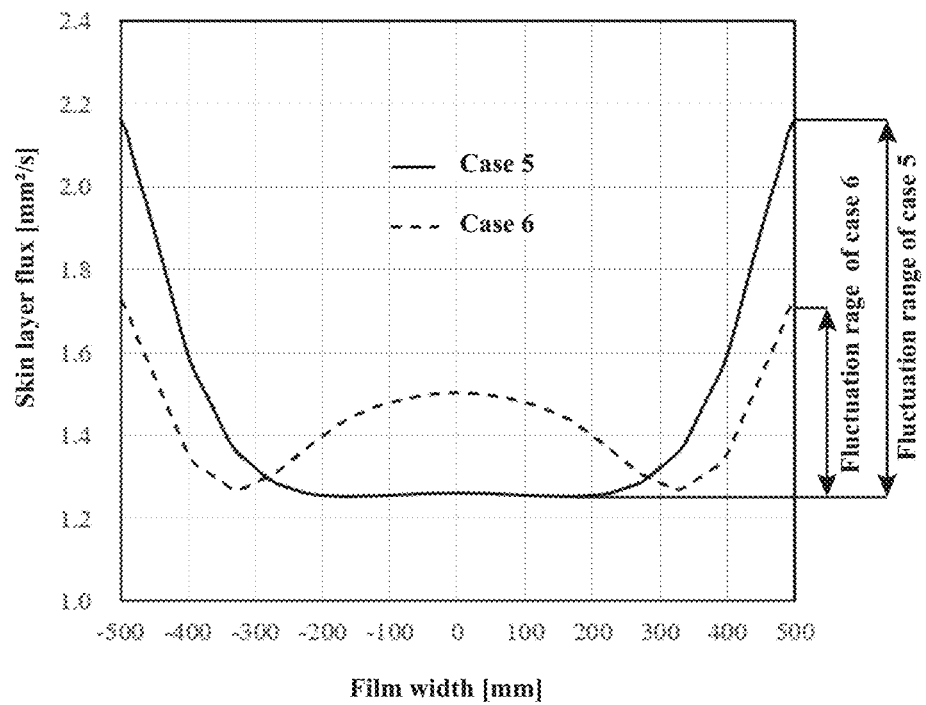
[FIG.21(b)]
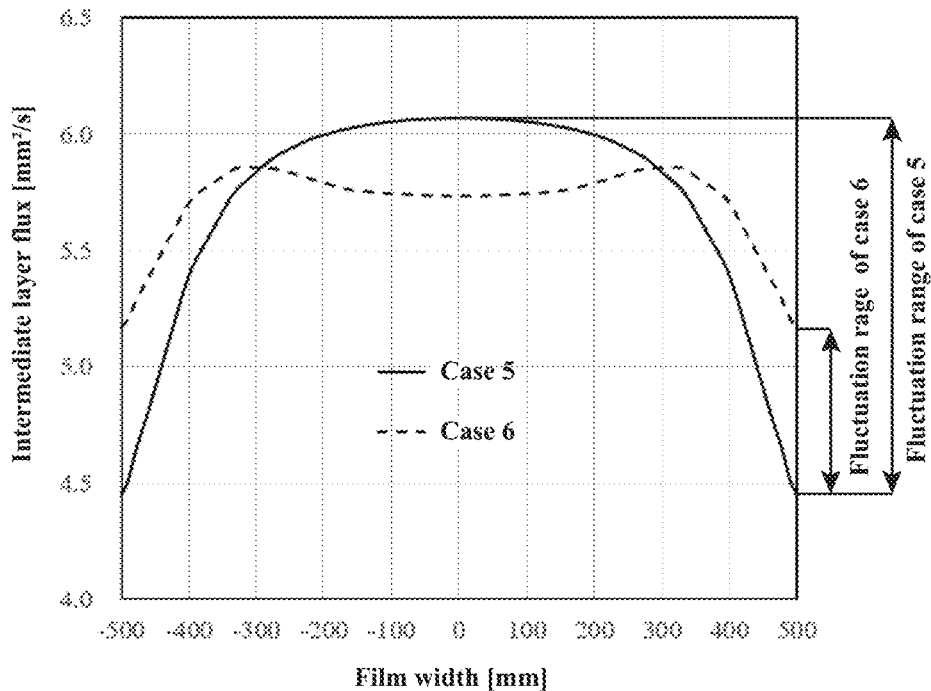

[FIG.22(a)]
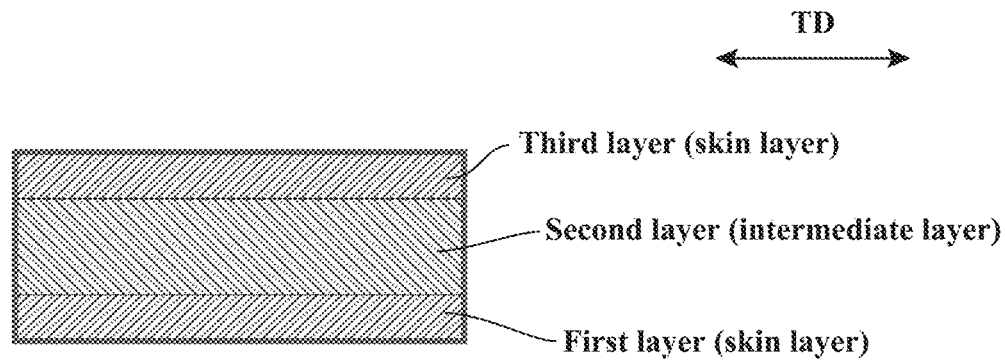
[FIG.22(b)]
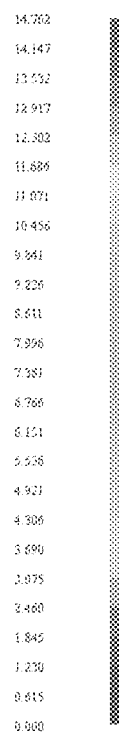
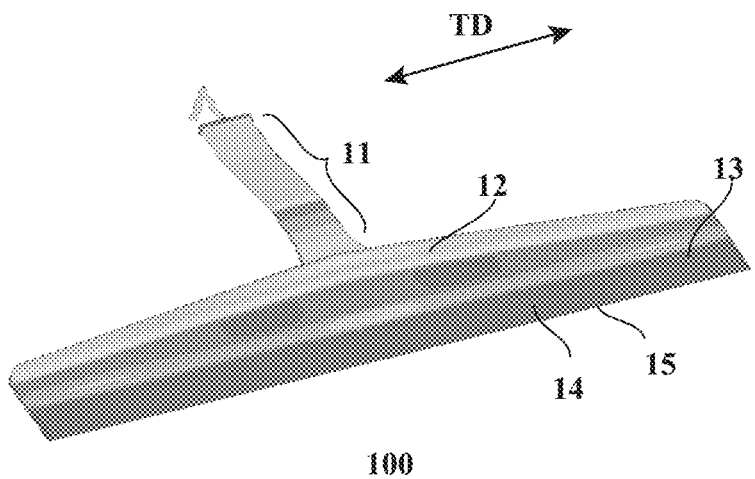

COMPUTER READABLE STORAGE MEDIUM STORING MULTILAYER FLUID ANALYSIS PROGRAM, MULTILAYER FLUID ANALYSIS SYSTEM, AND MULTILAYER FLUID ANALYSIS METHOD

BACKGROUND

The present invention relates to a computer readable storage medium storing a multilayer fluid analysis program, a multilayer fluid analysis system, and a multilayer fluid analysis method.

In recent years, research on numerical analysis technology for coextrusion processes has been advanced, and there has been viscoelastic flow analysis using a three-dimensional numerical analysis method. However, many of analysis methods relate to basic research content, and few three-dimensional analyzes target resin molding equipment for practical use. This is because mesh generation and analysis methods are complicated and complicated processes such as remeshing are required, and thus a huge amount of calculation is necessary to obtain a highly accurate analysis result, which requires a lot of time until output of calculation results.

Therefore, a 2.5-dimensional analysis method for a multilayer fluid is used as disclosed in Japanese Registered Patent No. JP6547157 (Patent Document). Since the state change of the multilayer fluid is analyzed as 2.5 dimensions in which each element has information about a layer thickness in a finite element model, analysis content can be simplified as compared to three-dimensional multilayer fluid analysis and the amount of calculation can be reduced, allowing a reduction of time until a result output. Further, the element division can be automatically performed as compared to three-dimensional fluid analysis, and a complicated process such as remeshing becomes unnecessary.

SUMMARY

In the multilayer fluid analysis of Patent Document, a layer thickness of each layer is calculated based on equilibrium of stress in a normal direction and continuity of velocities between layers from a constitutive equation and a motion equation of a fluid on the assumption that the fluid is a viscous fluid and in a fully developmental state. The heat flow data of each layer is calculated from the layer of conservation of energy.

Since the equilibrium equation in the normal direction described in Patent Document 1 is determined based on the pressure, viscosity, and layer thickness in each layer, 2.5-dimensional fluid analysis is performed on the assumption that the layer thickness in a transverse direction (TD) is constant as illustrated in FIG. 22($a$). As illustrated in FIG. 22($b$), an analysis result is output such that the layer thickness in the TD is constant in a feed block 11. However, since an actual polymer is a viscoelastic substance, which has both viscous and elastic properties, the analysis method shown in Patent Document 1 has difficulty in dealing with various problems occurring in a field of plastic film production.

As illustrated in FIG. 4, respective layers merge at a junction P and spread in the TD at a manifold 12 via the feed block 11 in a feed block type T-die 100. In a cross section of a two-layer fluid having different viscosities schematically as illustrated in FIG. 9, it has been known that when the viscosity of a lower layer is η1 and the viscosity of an upper layer is η2 larger than η1, an encapsulation phenomenon occurs in which the low-viscosity lower layer encapsulates the high-viscosity upper layer from both ends. When flowing into the manifold 12 with a large variation in the thickness of each layer, the effect on the produced film cannot be ignored.

To reduce an influence of such an encapsulation phenomenon and to make the thickness of each layer uniform, a cross-sectional shape of the feed block 11 is changed as illustrated in FIG. 14($a$) and FIG. 15($d$). However, measuring actual state of each layer in the feed block 11 is difficult, and many demonstration experiments are required to optimize the cross-sectional shape. From such a background, there is a demand for an analysis method capable of expressing the encapsulation phenomenon in the 2.5-dimensional multilayer flow analysis program.

Therefore, an object of the invention is to provide a computer readable storage medium storing a multilayer fluid analysis program, a multilayer fluid analysis system, and a multilayer fluid analysis method capable of performing an analysis that can express the encapsulation phenomenon in a 2.5-dimensional multilayer flow analysis.

In order to attain the above and other objects, the invention provides a computer-readable non-transitory storage medium storing a multilayer fluid analysis program for analyzing a multilayer fluid on a feed block type T-die as 2.5 dimensions in which each layer is divided into elements and each of the elements has information about a layer thickness in a finite element model for the multilayer fluid. The multilayer fluid analysis program causes a computer to execute: a layer thickness calculation process for calculating the layer thickness under a condition that stresses in a normal direction and a tangential direction equilibrate on an interface of each layer and a flow velocity on the interface is continuous, without considering a fluid flow in a thickness direction of the layer thickness, considering a viscoelastic effect of the multilayer fluid to analyze an encapsulation phenomenon in a feed block on a downstream side of a junction of each layer, and based on a shape of a rectangular cross section of the feed block and a second normal stress difference of resin in the feed block assuming that the layer thickness in a transverse direction fluctuates in a developmental state; and a display process for displaying a calculation result of the layer thickness calculation process for each layer in the transverse direction and an machine direction of the multilayer fluid from an upstream side of the junction of each layer to the downstream side of the junction.

Preferably, the invention provides a computer-readable non-transitory storage medium storing the multilayer fluid analysis program. The layer thickness is calculated in the layer thickness calculation process by solving an equilibrium equation of the stress in the normal direction represented by the following simultaneous equations:

$$-p_l + 2\eta_l \dot{\varepsilon}_l + \psi_{2,l} \langle \dot{\gamma}_l^2 \rangle = -p_{l+1} + 2\eta_{l+1} \dot{\varepsilon}_{l+1} + \psi_{2,l+1} \langle \dot{\gamma}_{l+1}^2 \rangle$$
$$\text{for } l = 1 \sim n-1 \qquad \text{[Formula 1]}$$

wherein $p_l$ denotes a pressure in each layer, $\eta_l$ denotes a viscosity, $\Psi_{2,l}$ denotes a second normal stress difference coefficient, $\dot{\varepsilon}_l$ denotes a strain rate in the thickness direction, $\dot{\gamma}_l$ denotes a shear strain rate, and l denotes a layer number, and the Formula 1 is simultaneous differential equations in which layers are simultaneous from a first layer to an lth layer.

Preferably, the computer-readable non-transitory medium storing the multilayer fluid analysis program according to claim 1 or 2, wherein a pressure gradient in the transverse direction is averaged by a Criminale Erickson Filbey model (CEF model) capable of expressing a viscoelastic surplus stress tensor in the layer thickness calculation process, and the layer thickness is calculated based on the simultaneous differential equations derived using a theoretical solution of the pressure gradient in the machine direction with respect to a flow velocity distribution of a single-layer steady viscous flow in a rectangular cross section.

According to another aspect, the invention provides a computer-readable non-transitory storage medium storing a multilayer fluid analysis program for analyzing a multilayer fluid on a feed block type T-die as 2.5 dimensions in which each layer is divided into elements and each of the elements has information about a layer thickness in a finite element model for the multilayer fluid. The multilayer fluid analysis program causes a computer to execute: a heat flow calculation process for calculating heat flow data of the elements under a condition that stresses in a normal direction and a tangential direction equilibrate on an interface of each layer and a flow velocity on the interface is continuous, without considering a fluid flow in a thickness direction of the layer thickness, considering a viscoelastic effect of the multilayer fluid to analyze an encapsulation phenomenon in a feed block on a downstream side of a junction of each layer, and based on a shape of a rectangular cross section of the feed block and a second normal stress difference of resin in the feed block assuming that a pressure gradient occurs in the cross section orthogonal to a machine direction in a developmental state; and a display process for displaying a calculation result of the heat flow calculation process for each layer in the machine direction and a transverse direction of the multilayer fluid from an upstream side of the junction of each layer to the downstream side of the junction.

According to another aspect, the invention provides a multilayer fluid analysis system for analyzing a multilayer fluid on a feed block type T-die as 2.5 dimensions in which each layer is divided into elements and each of the elements has information about a layer thickness in a finite element model for the multilayer fluid. The multilayer fluid analysis system includes: a layer thickness calculation unit for calculating the layer thickness under a condition that stresses in a normal direction and a tangential direction equilibrate on an interface of each layer and a flow velocity on the interface is continuous, without considering a fluid flow in a thickness direction of the layer thickness, considering a viscoelastic effect of the multilayer fluid to analyze an encapsulation phenomenon in a feed block on a downstream side of a junction of each layer, and based on a shape of a rectangular cross section of the feed block and a second normal stress difference of resin in the feed block assuming that the layer thickness in a transverse direction fluctuates in a developmental state; and a display unit for displaying a calculation result of the layer thickness calculation unit for each layer in the transverse direction and a machine direction of the multilayer fluid from an upstream side of the junction of each layer to the downstream side of the junction.

According to another aspect, the invention provides a multilayer fluid analysis method for analyzing a state change of a multilayer fluid on a feed block type T-die as 2.5 dimensions in which each layer is divided into elements and each of the elements has information about a layer thickness in a finite element model of the multilayer fluid. The multilayer fluid analysis method includes: a step of calculating the layer thickness under a condition that stresses in a normal direction and a tangential direction equilibrate on an interface of each layer and a flow velocity on the interface is continuous, without considering a fluid flow in a thickness direction of the layer thickness, considering a viscoelastic effect of the multilayer fluid to analyze an encapsulation phenomenon in a feed block on a downstream side of a junction of each layer, and based on a shape of a rectangular cross section of the feed block and a second normal stress difference of resin in the feed block assuming that the layer thickness in a transverse direction fluctuates in a developmental state; and a step of displaying a calculation result of the step of calculating the layer thickness for each layer in the transverse direction and a machine direction of the multilayer fluid from an upstream side of the junction of each layer to the downstream side of the junction.

According to the invention, since the layer thickness is calculated on the assumption that the layer thickness fluctuates in the TD in each layer, the fluid analysis can be performed based on a phenomenon actually occurring. In particular, the multilayer fluid analysis can express the encapsulation phenomenon in which a fluid having low viscosity encapsulates a fluid having high viscosity in the multilayer fluid having different viscosities. In a conventional 2.5-dimensional analysis, the analysis is performed on the assumption that a fluid to be analyzed is in a fully developmental state and is a viscous fluid, and a layer thickness in the TD is constant. However, in the present invention, an equilibrium equation of stress in the normal direction is calculated by assuming that the fluid is approximately viscoelastic, allowing the analysis to be performed on the basis that the layer thickness fluctuates in the TD.

Since a polymer such as plastic has a viscoelastic behavior having both viscous and elastic properties, a constitutive equation of viscoelasticity may be used for a three-dimensional multilayer fluid analysis. However, the three-dimensional viscoelasticity constitutive equation is considerably complicated and difficult to handle, and requires large amount of calculation. The inventor has achieved in adapting the three-dimensional constitutive equation of viscoelasticity to 2.5 dimensions owing to use various boundary conditions without considering the flow in the layer thickness direction. That is, the fluid is not treated as completely viscoelastic in the 2.5-dimensional multilayer fluid analysis and is assumed to be approximately viscoelastic. In this way, analysis contents can be simplified and amount of calculation can be reduced in comparison to the three-dimensional multilayer fluid analysis. Further, various problems occurred in the actual plastic molding can be handled while promptly obtaining output results. In particular, the influence of the flow in the thickness direction is small in a thin multilayer fluid such as a film, so that highly accurate results can be obtained even when the influence of the flow is not taken into consideration.

Further, the layer thickness is calculated by solving the stress equilibrium equation in the normal direction of Formula 1 in the layer thickness calculation process. Here, a third term of the stress equilibrium equation is not expressed in a conventional 2.5-dimensional analysis, and the viscoelasticity constitutive equation of Formula 1 includes the third term. In this way, the equilibrium of the stress in the normal direction is contributed by a second normal stress difference coefficient, which is a physical property value.

Therefore, the invention provides a computer readable storage medium storing a multilayer fluid analysis program, and a multilayer fluid analysis system capable of performing the analysis that can express the encapsulation phenomenon in the 2.5-dimensional multilayer flow analysis.

BRIEF DESCRIPTION OF DRAWINGS

FIG. 1 is a block diagram of a multilayer fluid analysis system according to an embodiment of the invention.

FIG. 2 is a flowchart of the multilayer fluid analysis system according to the embodiment of the invention.

FIG. 3 (a) and FIG. 3(b) are condition input windows displayed on a display unit of the multilayer fluid analysis system according to the embodiment of the invention.

FIG. 4 is a preview window of a T-die displayed on the display unit of the multilayer fluid analysis system according to the embodiment of the invention.

FIG. 5 is a diagram illustrating an analysis procedure of the multilayer fluid analysis system according to the embodiment of the invention.

FIG. 6 is a diagram illustrating a scheme of information about layer thickness of an element in the multilayer fluid analysis system according to the embodiment of the invention.

FIG. 7 is a diagram illustrating a surface region and a flow rate of the multilayer fluid analysis system according to the embodiment of the invention.

FIG. 8 is a flowchart illustrating calculation of the multilayer fluid analysis system according to the embodiment of the invention.

FIG. 9 is a schematic diagram illustrating an encapsulation phenomenon in the multilayer fluid analysis system according to the embodiment of the invention.

FIG. 10 is a graph illustrating a relationship between a TD position and a shape factor of the multilayer fluid analysis system according to the embodiment of the invention.

FIG. 11 is a diagram illustrating an analysis condition of the multilayer fluid analysis system according to the embodiment of the invention.

FIG. 12 is a cross-sectional view illustrating an interface formation state at a feed block outlet in cases 1 to 3 of the multilayer fluid analysis system according to the embodiment of the invention.

FIG. 13 is a diagram illustrating a layer thickness analysis result in the feed block of the multilayer fluid analysis system according to the embodiment of the invention.

FIG. 14(a) is a diagram illustrating a cross-sectional shape at a junction of the multilayer fluid analysis system according to the embodiment of the invention.

FIG. 14(b) is a cross-sectional view illustrating an interface formation state at the feed block outlet of the multilayer fluid analysis system according to the embodiment of the invention.

FIG. 14(c) is a diagram illustrating a layer thickness analysis result in the feed block of the multilayer fluid analysis system according to the embodiment of the invention.

FIG. 15(a) is a diagram illustrating a model shape of the T-die of the multilayer fluid analysis system according to the embodiment of the invention.

FIG. 15(b) is a diagram illustrating 2.5-dimensional element division of the T-die of the multilayer fluid analysis system according to the embodiment of the invention.

FIG. 15(c) is a diagram illustrating three-dimensional element division of the T-die of the multilayer fluid analysis system according to the embodiment of the invention.

FIG. 15(d) is cross-sectional views of the junction of the multilayer fluid analysis system according to the embodiment of the invention.

FIG. 15(e) is a table illustrating an analysis condition of the multilayer fluid analysis system according to the embodiment of the invention.

FIG. 16(a) is a diagram illustrating a layer thickness analysis result of a skin layer in case 5 in the multilayer fluid analysis system according to the embodiment of the invention.

FIG. 16(b) is a diagram illustrating a layer thickness analysis result of the skin layer in case 6 in the multilayer fluid analysis system according to the embodiment of the invention.

FIG. 17(a) is a diagram illustrating a layer thickness analysis result of an intermediate layer in case 5 in the multilayer fluid analysis system according to the embodiment of the invention.

FIG. 17(b) is a diagram illustrating a layer thickness analysis result of the intermediate layer in case 6 in the multilayer fluid analysis system according to the embodiment of the invention.

FIG. 18 is a diagram illustrating analysis results for the interface formation state of each position on the T-die of the multilayer fluid analysis system according to the embodiment of the invention.

FIG. 19(a) is a diagram illustrating a temperature distribution of the T-die of case 5 in the multilayer fluid analysis system according to the embodiment of the invention.

FIG. 19(b) is a diagram illustrating the temperature distribution of the T-die of case 6 in the multilayer fluid analysis system according to the embodiment of the invention.

FIG. 20(a) is a diagram illustrating a pressure distribution of the T-die of case 5 in the multilayer fluid analysis system according to the embodiment of the invention.

FIG. 20(b) is a diagram illustrating a pressure distribution of the T-die of case 6 in the multilayer fluid analysis system according to the embodiment of the invention.

FIG. 21(a) is a graph illustrating a flux of the skin layer at a lip in the multilayer fluid analysis system according to the embodiment of the invention.

FIG. 21(b) is a graph illustrating a flux of the intermediate layer at the lip in the multilayer fluid analysis system according to the embodiment of the invention.

FIG. 22(a) is a diagram illustrating an interface formation state at a feed block outlet of a conventional multilayer fluid analysis system.

FIG. 22(b) is a diagram illustrating an analysis result of a skin layer in the conventional multilayer fluid analysis system.

DETAILED DESCRIPTION OF THE PREFERRED EMBODIMENTS

A multilayer fluid analysis system 1 according to an embodiment of the invention will be described with reference to FIGS. 1 to 21(b). As illustrated in FIG. 1, the multilayer fluid analysis system 1 includes a control unit 2, a storage unit 3, an input unit 4, and a display unit 5. The multilayer fluid analysis system 1 performs a multilayer fluid analysis during film production on a T-die, a spiral mandrel die, etc. by executing a multilayer fluid analysis program 31 installed in the storage unit 3 on a computer as hardware.

The multilayer fluid analysis system 1 according to the present embodiment is particularly effective for the feed block type T-die as illustrated in FIG. 4. The feed block type T-die is expanded in a transverse direction (TD) by a manifold 12 after the respective layers are merged. On the other hand, a multi-manifold type T-die is expanded in the TD by the manifold before respective layers are merged. Even though the feed block type T-die is widely used due to low cost, it has been known that an encapsulation phenomenon occurs in which a low-viscosity layer encapsulates a high-viscosity layer after the junction of each layer.

When the encapsulation phenomenon occurs, a layer thickness of each layer in the film may be non-uniform. The multilayer film formed by the T-die is added to masterbatches to give various functions to its skin layer. When a balance between the skin layer and an intermediate layer is lost due to the encapsulation phenomenon, the performance of the film may be degraded. The multilayer fluid analysis system 1 of the present embodiment is a calculation model (PEM: Pseudo Encapsulation Model) capable of expressing the encapsulation phenomenon in the feed block type T-die, and thus can be used for flow path design, etc. of the feed block type T-die. Note that an analysis target is not limited to the T-die, and application to other multilayer fluids is allowed.

The control unit 2 is a CPU and is configured to develop various applications such as an OS (Operating System) stored in the storage unit 3. The control unit 2 includes a layer thickness calculation unit 21 and a heat flow calculation unit 22. The layer thickness calculation unit 21 calculates the layer thickness of each layer in the multilayer fluid, and the heat flow calculation unit 22 calculates various data related to a heat flow such as temperature, pressure, flow rate, and flow velocity of each layer in the multilayer fluid.

The storage unit 3 includes a hard disk drive (HDD), a read only memory (ROM), and a random access memory (RAM). The HDD stores various applications such as a multilayer fluid analysis program 31 and physical property data required for fluid analysis. The RAM is a volatile memory used as a work area of the program.

The input unit 4 is an input interface operated by a user using the multilayer fluid analysis system 1, and includes a pointing device such as a mouse, a keyboard, a touch panel, etc.

The display unit 5 is configured to display a graphical user interface (GUI) of the multilayer fluid analysis program 31 as illustrated in FIGS. 3(a) and 3(b) and analysis results as illustrated in FIGS. 16(a) to 20(b) described later.

FIG. 2 illustrates a flowchart when the control unit 2 executes the multilayer fluid analysis program 31. When the multilayer fluid analysis program 31 is activated, the control unit 2 displays a condition input window 6 as illustrated in FIG. 3(a) on the display unit 5 in response to the operation of the input unit 4 by the user. The condition input window 6 includes a data reading unit 61 for designating and reading physical property data stored in the storage unit 3, a molding condition input unit 62 for inputting molding conditions, and an analysis type selection unit 63. The user operates the input unit 4 to read a desired physical property data file and a mesh data file in the data reading unit 61 and to input the molding condition of an extruder to the molding condition input unit 62 (S1). Mesh creation (element division) is executed based on the inputted condition, and a multilayer fluid analysis model as illustrated in FIG. 4 is created (S2). In the present embodiment, as illustrated in the figures, a three-layer fluid analysis is performed in the feed block type T-die.

A first layer L1, a second layer L2, and a third layer L3 merge at the junction P, pass through the feed block 11 having a substantially rectangular cross-sectional shape, spread in the TD at the manifold 12, spread slightly in a thickness direction at a choke portion 13, and is discharged from a lip 15 via a lip land 14. Created element data can be stored in the storage unit 3. Although, three-dimensional T-die is displayed in in a preview window by selecting a three-dimensional display, each element is analyzed as 2.5 dimensions holding only information related to the thickness direction.

As illustrated in FIG. 5, the multilayer fluid analysis program 31 performs a two-step analysis using calculated data output by an analysis 1 as initial data of an analysis 2. The calculation can be simplified and the result can be rapidly output compared to the case where all analyzes are performed in single step. The analysis 1 analyzes a region in a developmental state from the upstream of each layer to an outlet of the feed block 11 via the junction P. In the analysis 1, the fluid of each layer is approximately assumed to be a viscoelastic fluid, and the analysis is performed by the calculation model (PEM) capable of expressing the encapsulation phenomenon. The analysis 2 analyzes a region from the manifold 12 to the lip 15 in a fully developmental state. In the analysis 2, the analysis is performed by the conventional method. The developmental state means that the pressure on the interface of each layer is unstable and the layer thickness fluctuates, and the fully developmental state means that the pressure on the interface of each layer is stable.

When the calculation of the analysis 1 is performed by the multilayer fluid analysis program 31, the user selects the developmental state in the analysis type selection unit 63 as illustrated in FIG. 3(a), and presses a calculation button (not illustrated). In this way, the control unit 2 calculates the layer thickness and heat flow up to the outlet of the feed block 11 in each layer in consideration of the viscoelastic effect of the fluid based on data input to the condition input window 6 and stored in the storage unit 3 (S3).

When the calculation of analysis 2 is performed by the multilayer fluid analysis program 31, a concatenated file selection unit 64 is displayed in response to selecting the fully developmental state in the analysis type selection unit 63 and turning ON a check button for concatenated analysis as illustrated in FIG. 3(b). The user selects data output by the analysis 1 in the concatenated file selection unit 64, and presses the calculation button (not illustrated). In this way, the control unit 2 calculates the layer thickness and the heat flow from the manifold 12 to the lip 15, and outputs calculation results from a most upstream portion to the lip 15 as illustrated in FIGS. 19(a) to 20(b) on the display unit 5 (S4). Since the analysis 2 is the multilayer flow analysis in the known fully developmental state, detailed description thereof will be omitted, and the calculation flow of the analysis 1 will be described in detail below.

Elements used in calculation formulas described later will be explained with reference to FIGS. 6 and 7. In the present embodiment, since the fluid analysis is performed in the 2.5-dimensional, an element e possesses information related to the thickness direction as illustrated in FIG. 6. The element e is of substantially rectangular shape, the center of gravity G is defined at a substantially central portion, and a node $\alpha$, a node $\beta$, a node $\gamma$, and a node $\delta$ are defined at four corners. A plurality of finite difference grid points is defined for the element e in the thickness direction, and layer thickness $h^I \ldots h^n$ are defined as distances between the finite difference grid points. The sum of the layer thicknesses $h^I \ldots h^n$ is equivalent to a layer thickness H of the element e. The control unit 2 disposes variable numbers on the respective finite difference grid point and performs fluid analysis. The 2.5-dimensional fluid analysis in the present embodiment is performed without consideration of a fluid flow in the thickness direction of the layer.

As illustrated in FIG. 7, in the element e, a surface region S is defined as a value obtained by multiplying a distance between a midpoint between the node $\alpha$ and the node $\beta$ and a midpoint between the node $\alpha$ and the node $\gamma$ by a layer thickness h (hatched portion in the figure). A flow rate per unit time passing through the surface region S is referred to as a flow rate Q. Initial values of the surface region S and the flow rate Q are calculated from physical property data, a physical property value input to the condition input window 6, a value input to a T-die shape input window 7, etc.

A detailed description will be given of calculation executed by the control unit 2 in the analysis 1 with reference to FIG. 8. The control unit 2 sets various physical property values and the shape of the T-die input in S1 and S2 as initial values (S11). In this instance, a layer thickness $h^l$ of each layer is calculated by the following Formula 2 using a flow rate $Q^l$ and an initial viscosity $\eta^{l,0}$. Here, a superscript l denotes a layer number. In addition, a superscript 0 (zero) denotes an initial value.

$$h^{l,0} = \frac{\left(\eta_{vis}^{l,0} Q^l\right)^{1/3}}{\sum_{i=1}^{n}\left(\eta_{vis}^{l,0} Q^l\right)^{1/3}} H \quad \text{[Formula 2]}$$

In Formula 2, H is the layer thickness H of the element e as illustrated in FIG. 6. In Formula 2, a layer thickness from the first layer L1 to the third layer L3 is set in inverse proportion to the ⅓ power of a layer flow rate. The viscosity is represented by a non-Newtonian pure viscosity model such as Power Law, Carreau, Cross, etc., and an initial viscosity $\eta^{l,0}_{vis}$ is a zero shear viscosity at a reference temperature of a nonlinear pure viscosity model. The control unit 2 calculates a predetermined initial viscosity $\eta^{l,0}_{vis}$ from the parameters of the viscosity model stored in the storage unit 3, density, specific heat, and thermal conductivity.

The control unit 2 calculates an initial layer pressure $p^{l,0}$ based on the following pressure formula (S12). Here, S denotes the surface region as illustrated in FIG. 7, and Q denotes the flow rate of the fluid passing through the surface region S. Subscripts α and β represent node numbers.

$$S_{\alpha\beta}^{l,0} p_{\beta}^{l,0} + Q_{\alpha}^{l} = 0 \text{ for } l=1\sim n \quad \text{[Formula 3]}$$

In Formula 3, since the flow rate Q and the surface region S are known, the initial layer pressure $p^{l,0}$ for l=1 to n is calculated. For l=1 to n indicates a simultaneous equation from l=1 to l=n. The initial layer pressure $p^{l,0}$ is a provisional pressure and a value apart from the actual pressure. This value converges to a realistic value by looping calculation in S19 (S19: NO).

The layer thickness calculation unit 21 calculates the layer thickness h by solving the following simultaneous equations based on the initial layer thickness h and the initial layer pressure p obtained by Formula 2 and Formula 3 (S13). A superscript k denotes the number of loops from S13 to S18 when the value does not converge in S19 (S19: NO).

$$H_{\beta}^{e} = \sum_{l=1}^{n} h_{\beta}^{l,k}, \quad \text{[Formula 4]}$$

$$H_{\alpha\beta}^{l,k-1} h_{\beta}^{l,k} = H_{\alpha\beta}^{l+1,k-1} h_{\beta}^{l+1,k-1} + D_{\alpha\beta}^{y}(p_{\beta}^{l,k-1} - p_{\beta}^{l+1,k-1}) \text{ for } l=1\sim n-1 \quad \text{[Formula 5]}$$

As illustrated in FIG. 6, formula 4 shows that the sum of layer thicknesses $h^{l,k}_{\beta}$ for l=1 to n in the element is equal to the layer thickness H of the layer. Here, $H^{e}_{\beta}$ in the equation indicates the element layer thickness at the node β of the element e.

In Formula 5, D denotes a predetermined coefficient. At the first time of the first calculation, i.e., k=1, $H^{l+1,0}_{\alpha\beta}$, $h^{l+1,0}_{\beta}$, $p^{l,0}_{\beta}$, and $p^{l+1,0}_{\beta}$ on the right side have already calculated in S11 and S12. Since $h^{l,1}_{\beta}$ is unknown on the left side and for l=1 to n, the number of unknowns is n. Here, since the number of interfaces between the respective layers in the case of n layers is n−1, the layer thickness h, which is the distance between respective lattice points, is calculated by simultaneously combining Formula 5 and Formula 4.

[Equilibrium of Stress in Normal Direction]

The following equilibrium equation of stress in the normal direction between adjacent layers is used to obtain the layer thickness by Formula 5. A coordinate system in the formula is defined as illustrated in FIG. 9 in which the cross section of the feed block 11 is temporarily divided into two layers. FIG. 9 shows a phenomenon that a lower layer having a low viscosity qi encapsulates an upper layer having a high viscosity $\eta_2$.

$$-p_l + 2\eta_l \dot{\varepsilon}_l + \psi_{2,l}\langle \dot{\gamma}_l^2\rangle = -p_{l+1} + 2\eta_{l+1}\dot{\varepsilon}_{l+1} + \psi_{2,l+1}\langle \dot{\gamma}_{l+1}^2\rangle \text{ for } l=1\sim n-1 \quad \text{[Formula 6]}$$

In Formula 6, $P_l$ denotes a pressure of a layer l, $\eta_l$ denotes a viscosity, $\varepsilon_l$ denotes an elongation strain rate in the thickness direction, and $\Psi_{2,l}$ denotes a second normal stress difference coefficient. Formula 7 represents an average value of the square of a shear strain rate in the thickness direction. In the conventional 2.5-dimensional fluid analysis, the equilibrium of the stress in the normal direction is expressed only by a first term and a second term and a third term of Formula 6 does not exist, because the fluid is assumed to be a viscous fluid. Since the elongation strain rate could approximately assume a change rate of the layer thickness $h_l$, the layer thickness of each layer was constant in the TD in the feed block 11 as illustrated in FIGS. 22(a) and 22(b). In other words, the conventional multilayer fluid analysis could not express the encapsulation phenomenon. According to the multilayer fluid analysis system 1 of the present embodiment, the third term is added by assuming that the fluid is approximately viscoelastic. In the analysis results of the multilayer fluid analysis system 1 of the present embodiment, the layer thickness of each layer fluctuates in the TD as illustrated in FIG. 12. Hereinafter, the third term will be examined in detail.

The sign < > in the third item represents averaging in the thickness direction. Formula 7 represents the square of the strain rate averaged in the thickness direction.

$$\langle \dot{\gamma}_l^2 \rangle = \left(\frac{W}{2\eta_l}\frac{\partial p_l}{\partial x}\right)^2 g_f(z) \quad \text{[Formula 7]}$$

Here, a shape factor $g_f(z)$ is given by Formula 8.

$$g_f(z) = \frac{32}{\pi^4}\left(\frac{H}{W}\right)^2 \sum_{n=1}^{\infty} \frac{1}{(2n-1)}\left(\frac{\sinh\left(\frac{(2n-1)\pi z}{H}\right)}{\cosh\left(\frac{(2n-1)\pi W}{2H}\right)}\right)^2 \quad \text{[Formula 8]}$$

The shape factor $g_f(z)$ is determined only by a shape of the flow path as shown in Formula 8, and increases as away from a center C in a z-direction as illustrated in FIG. 10. The shape factor $g_f(z)$ becomes maximum value when a flow path aspect ratio H/W=1, i.e., the cross-sectional shape of the feed block 11 becomes square, and the encapsulation phenomenon remarkably occurs. This is because when $g_f(z)$ becomes maximum value, the square of the strain rate becomes maximum value in Formula 7, and the second normal stress difference coefficient $\Psi_2$ inevitably has a negative value, so that the third term of Formula 6 becomes negative, the normal stress becomes smaller, and thus the layer thickness becomes larger. As the aspect ratio becomes smaller, the encapsulation phenomenon is suppressed, and the effect appears only in the vicinity of a wall surface. Such behavior is consistent with an actual phenomenon that the encapsulation phenomenon occurs in the feed block 11 having high aspect ratio and hardly occurs at downstream after the manifold 12 in the feed block having remarkably low aspect ratio.

A flow in which the constitutive equation of viscoelasticity used in three-dimensional fluid analysis is applied to 2.5 dimensions will be described below. The present embodiment employs a Criminale Erickson Filbey model (CEF model) capable of expressing a viscoelastic surplus stress tensor. To apply to 2.5 dimensions, a steady flow with a constant viscosity is assumed to uniform a flow velocity component in a mechanical direction (MD) without the consideration of flow velocities in the y-direction and the z-direction. Motion equations of Formula 9 is obtained by using a calculated surplus stress component.

$$\frac{\partial p}{\partial x} = \frac{\partial \tau_{xx}}{\partial x} + \frac{\partial \tau_{xy}}{\partial y} + \frac{\partial \tau_{xz}}{\partial z} = \frac{\partial}{\partial y}(\eta \dot{\gamma}_{xy}) + \frac{\partial}{\partial z}(\eta \dot{\gamma}_{xz})$$

$$\frac{\partial p}{\partial y} = \frac{\partial \tau_{xy}}{\partial x} + \frac{\partial \tau_{yy}}{\partial y} + \frac{\partial \tau_{yz}}{\partial z} = \frac{\partial}{\partial y}(\psi_2 \dot{\gamma}_{xy}^2) + \frac{\partial}{\partial z}(\psi_2 \dot{\gamma}_{xy} \dot{\gamma}_{xz})$$

$$\frac{\partial p}{\partial z} = \frac{\partial \tau_{zx}}{\partial x} + \frac{\partial \tau_{yz}}{\partial y} + \frac{\partial \tau_{zz}}{\partial z} = \frac{\partial}{\partial y}(\psi_2 \dot{\gamma}_{xy} \dot{\gamma}_{xz}) + \frac{\partial}{\partial z}(\psi_2 \dot{\gamma}_{xz}^2)$$

[Formula 9]

Here, according to a second and a third equations of Formula 9, the second normal stress difference coefficient $\Psi_2$ contributes to a pressure gradient in the cross section as illustrated in FIG. 9. In the case of a viscous flow in the fully developmental state, a pressure gradient is generated only in the MD from the first formula, and the pressure in the cross section is constant. In the multilayer fluid analysis system 1 according to the present embodiment, a pressure gradient is generated in the cross section where a velocity gradient of a flow velocity component in the MD is perpendicular to the MD by considering the second normal stress difference in the developmental state. In other words, by considering the second normal stress difference, a pressure gradient is generated in the y-direction and the z-direction as shown in the second and third formulas, and a pressure bias in the cross section can be expressed.

The third formula of Formula 9 is averaged in the thickness direction for applying to the 2.5-dimensional analysis. Further, assuming that the second normal stress difference coefficient and a flow path thickness are constant with respect to the TD, the following evaluation formula for a pressure gradient averaged in the thickness direction is obtained.

$$\left\langle \frac{\partial p}{\partial z} \right\rangle = \frac{1}{H} \int_{-H/2}^{H/2} \frac{\partial p}{\partial z} dy = \frac{\psi_2}{H} \frac{\partial}{\partial z} \left( \int_{-H/2}^{H/2} \dot{\gamma}_{xz}^2 dy \right)$$

[Formula 10]

Formula 6 is obtained by Formula 10 and a theoretical solution of the first formula of Formula 9 for a flow velocity distribution of a single-layer steady viscous flow in a rectangular cross section. The constitutive equation used in the three-dimensional viscoelastic fluid analysis is allowed to be applied to the 2.5-dimensional viscoelastic fluid by averaging in the thickness direction and using various boundary conditions without considering the flow velocity in the thickness direction.

Since movement of the fluid in the thickness direction is not considered in the 2.5-dimensional fluid analysis, the total stress expressed by the sum of the pressure and the surplus stress calculated by a strain rate in the thickness direction, that is, a change rate of the thickness is in an equilibrium state between adjacent layers in Formula 6. That is, the sum of the pressure of a layer l and the surplus stress of the layer l is equal to the sum of the pressure of a layer l+1 and the surplus stress of the layer l+1. The surplus stress mentioned here means a general term for stresses in the normal direction generated by the flow of viscoelastic fluid in each layer. The flow mentioned here refers to a fluid flow in a direction orthogonal to the thickness direction, and the flow in the thickness direction is not considered as described above.

Assuming that the pressure and the viscosity are known, all the layer thicknesses can be obtained by Formulas 6 and 4 (S13). When a pressure equation of Formula 14 described later and Formula 6 are discretized using a weighted residual method for an element surface area, thereby obtaining Formula 5 expressed in a matrix format.

[Equilibrium of Stress in Shear Direction]

In the fluid analysis according to the present embodiment, since the problem is solved on the assumption that the pressure in each layer is different, it is necessary to consider the equilibrium of shear stress in a tangential direction between each layer. The pressure of an i-coordinate component is expressed by the following motion equation of the fluid.

$$\frac{\partial}{\partial h}\left(\eta_{vis} \frac{\partial u_i^l}{\partial h}\right) = p_{,i}^l$$

[Formula 11]

In Formula 11, $u_i^l$ denotes a flow velocity of the i-coordinate component of the layer l, and $p_{,i}^l$ denotes a pressure differentiated by the i-coordinate component of the layer l. The following equilibrium equation for the stress in the tangential direction can be established between the respective layers by integrating Formula 11 with respect to the layer thickness h and assuming that the stresses in the tangential direction are equilibrated on the interface of each layer, $$\eta_{vis}^l \frac{\partial u_i^l}{\partial h}\bigg|_{h=h^l} = p_{,i}^l h_i^l + A_i^l = \eta_{vis}^{l+1} \frac{\partial u_i^{l+1}}{\partial h}\bigg|_{h=0} = A_{l+1}^l$$

[Formula 12]

for $l = 1 \sim n - 1$

In Formula 12, $A_{i+1}^l$ is an integration constant. The equilibrium of the stress in the tangential direction refers to a state where the stress in the tangential direction is equilibrated on the interface between the first layer L1 and the second layer L2. An equation that guarantees the equilibrium of the stress in the tangential direction on the interface (Share stress continuity on interface) can be obtained from Formula 12.

[Continuity of Velocity at Interface]

Formula 11 is integrated with respect to the layer thickness h to obtain $u_i^l(h)$ of a velocity gradient in the i-coordinate component of the layer l.

$$u_i^l(h) = p_{,i}^l \int_0^h \frac{h}{\eta_{vis}^l} dh + A_i^l \int_0^h \frac{1}{\eta_{vis}^l} dh + B_i^l \quad \text{[Formula 13]}$$

In Formula 13, $B_i^l$ is an integration constant. Considering a non-slip boundary condition of an upper wall surface and a lower wall surface in the flow path, a continuous condition of the flow velocity on the interface of the multilayer fluid in a layer n−1 is expressed by the following equation.

$$u_i^l(h^l) = \quad \text{[Formula 14]}$$
$$p_{,i}^l \int_0^{h^l} \frac{h}{\eta_{vis}^l} dh + A_i^l \int_0^{h^l} \frac{1}{\eta_{vis}^l} dh + B_i^l = u_i^{l+1}(0) = B_i^{l+1}$$
$$\text{for } l = 1 \sim n-1$$

In Formula 14, when an integral value in the thickness direction is expressed by the following equation, a simultaneous equation system that guarantees the velocity continuity on the interface can be obtained.

$$\alpha^l = \int_0^{h^l} \frac{h}{\eta_{vis}^l} dh, \beta^l = \int_0^{h^l} \frac{h}{\eta_{vis}^l} dh \quad \text{[Formula 15]}$$

A predetermined simultaneous equation system can be obtained by the equilibrium of the stress in the tangential direction on the interface obtained by Formula 11, the continuity of the velocity on the interface obtained by Formulas 13 and 14, and the boundary condition on the upper wall surface and the lower wall surface of the flow path. In the present embodiment, since integration constants are $A_i^l$ and $B_i^l$ and the number of dimensions is three (i=1 to 3), six variables are defined as unknowns. When the number of layers is n, the unknown is 6n.

In S14, integration constants $A^{l,k}$ and $B_{l,k}$ are calculated by calculating a solution to this simultaneous equation system based on the initial layer pressure p calculated in S12, the layer thickness h calculated in S13, and the initial viscosity η set in S11 by the layer thickness calculation unit 21. As this analysis method, a SOR (Successive Over Relaxation) method is used.

In S15, the heat flow calculation unit 22 discretizes the energy equation using a finite difference method in the thickness direction and a 2.5-dimensional finite element weighted residual method in the flow direction. In the discretization by the finite difference method, a control volume for a difference grid as illustrated in FIG. 6 is used. A heat conduction difference equation in the thickness direction is simultaneous equations having a tridiagonal matrix as coefficients. These simultaneous equations can be analyzed element by element. On the other hand, since a thermal convection term includes a relationship of temperature information between adjacent elements and is simultaneous equations of a whole system, the SOR method (Successive Over Relaxation method) is used for analysis.

The heat flow calculation unit 22 calculates α and β represented by Formula 15 (S16). Here, the viscosity is evaluated by a nonlinear model that depends on the strain rate and temperature. The difference grid points as illustrated in FIG. 6 are used as integral values of the viscosity, and the temperature is used in the value calculated in S15. Further, a strain rate gradient uses the following relationship obtained by dividing both sides of Formula 11 by a viscosity $\eta^{l,k}_{vis}$.

$$\frac{\partial u_i^{l,k}}{\partial h} = p_{,i}^l \frac{h}{\eta_{vis}^{l,k}} + \frac{A_i^{l,k}}{\eta_{vis}^{l,k}} \quad \text{[Formula 16]}$$

The heat flow calculation unit 22 recalculates the pressure in each layer by analyzing the following pressure equation, etc. (S17).

$$S_{\alpha\beta}^l p_\beta^l + Q_\alpha^l + F_\alpha^l = 0 \text{ for } l=1 \sim n \quad \text{[Formula 17]}$$

F is set to 0 (zero) to calculate the initial value in Formula 3. However, when calculating the actual pressure, the pressure p is calculated by adding a coefficient F depending on α and β calculated in S16.

The heat flow calculation unit 22 calculates the flow rate Q by Formula 17 using the pressure obtained in S17 (S18). Further, the heat flow calculation unit 22 calculates the flow velocity based on Formula 14. The control unit 2 determines whether the computed various calculation values converge (S19). For example, when a value calculated for a kth time and a value calculated for a (k+1)th time are different values, the control unit 2 determines that the values do not converge (S19: NO), and the process returns to S13 to perform the calculations again. On the other hands, when the value calculated for the kth time and the value calculated for the (k+1)th time are compared and determined to be substantially the same or within a prescribed range, the control unit 2 determines that the various calculation values converge (S19: YES), and the calculation flow of the analysis 1 is ended.

In the multilayer fluid analysis program 31 according to the present embodiment, Formula 6 representing the equilibrium equation of stress in the normal direction, Formula 9 representing the equilibrium equation of stress in the tangential direction, and Formula 11 that guarantees the continuity of the velocity are satisfied on the interface of the first layer L1, the second layer L2, and the third layer L3. Note that Formula 9 representing the motion equation of the fluid is satisfied at the finite difference grid points in FIG. 6.

As illustrated in FIGS. 16(a) to 20(b), the control unit 2 displays the value calculated by S4 on the display unit 5 (S5). In the present embodiment, with regard to the flow of resin inside the T-die, the layer thickness from the most upstream portion to the outlet of the feed block 11 is displayed for each layer as illustrated in FIGS. 16 and 17, and the heat flow from the most upstream portion to the lip 15 is displayed as illustrated in FIGS. 19 and 20.

Next, a description will be given of the analysis results obtained by performing the multilayer flow analysis in the multilayer fluid analysis system 1 under a condition of FIG. 11 with reference to FIG. 12 and FIG. 13. A calculation time in the multilayer fluid analysis system 1 is about 15 minutes in a low-priced PC environment, and the 2.5-dimensional multilayer fluid analysis can significantly reduce the calculation time compared to a 3D model. As illustrated in the table of FIG. 11 the second normal stress difference coefficient ratio is changed while a viscosity ratio is in common in cases 1 to 3.

As illustrated in FIG. 12, as for the interface formation state at the outlet of the feed block 11, the skin layer of the low-viscosity fluid encapsulates the intermediate layer of the high-viscosity fluid in case 1. On the contrary, in case 2, the intermediate layer of the high-viscosity fluid encapsulates the skin layer of the low-viscosity fluid. In case 3, the first layer L1 encapsulates the second layer L2 and the second layer L2 encapsulates the third layer L3. As shown by these analysis results, the encapsulation phenomenon changes depending on the second normal stress difference ratio in addition to the viscosity ratio.

FIG. 13 illustrates a layer thickness distribution of the skin layer and the intermediate layer of case 1 in the feed block 11. The encapsulation phenomenon gradually progresses along the flow path of the feed block 11, and becomes most prominent at the outlet. At the outlet of the feed block 11, the thickness of the intermediate layer at a central portion is twice that of the skin layer at a central portion, and the thickness of the intermediate layer at ends is approximately half the thickness of the skin layer at ends.

FIGS. 14(a) to (d) illustrate an analysis condition and result as case 4 where the cross-sectional shape at the junction P is changed under the same condition as that of case 1. In the cross-section, the ends of the intermediate layer are thickened by 2 mm as illustrated in FIG. 14(a). As for the interface formation state at the outlet of the feed block 11, the encapsulation phenomenon is improved compared with the case 1 as illustrated in FIG. 14(b). As illustrated in FIG. 14(c), the intermediate layer fluctuates in layer thickness stepwise after merging with the skin layer, and has two peaks in the TD at the outlet. The skin layer fluctuates in layer thickness stepwise after merging with the intermediate layer, and has two depressions in the TD at the outlet.

When the cross-sectional shape at the junction is changed in the fluid analysis, an enormous amount of time is necessary for creating elements in the three-dimensional model due to reproducing an analysis model for each cross-sectional shape of the junction. On the other hand, in the 2.5-dimensional model, the analysis model of FIG. 11 can be used by numerically updating element thickness information of portions where the shape is changed.

Next, analysis results are illustrated in FIGS. 15(a) to 18 when the cross-sectional shape of the junction of the feed block 11 is changed. The feed block type T-die as the analysis model has a width of the lip 15 at 1000 mm and a lip clearance at 2 mm as illustrated in FIGS. 15(a) to 15(c). As illustrated in FIG. 15(d), the cross section of the junction P has a normal flat shape in case 5, and the cross section of the junction P has a shape in which four corners are chamfered in case 6. As illustrated in the three-dimensional model of FIG. 15(c), the flow path gradually expands in the y-direction toward the downstream from the junction P, and finally H=6 mm. Various extrusion conditions and physical property values are illustrated in FIG. 15(e).

As illustrated in FIGS. 16(a) and 17(a) of case 5, the skin layer encapsulates the intermediate layer, and thus the encapsulation phenomenon occurs. As illustrated in FIGS. 16(b) and 17(b) of case 6, the intermediate layer has two peaks in the TD, the skin layer has two depressions in the TD, and thus the encapsulation phenomenon is alleviated.

As illustrated in FIG. 18, a cross section A-A☐ represents the shape of the junction P. A cross section B-B ☐ represents the outlet of the feed block 11 where the encapsulation phenomenon occurs in case 5 and is alleviated in case 6. In a cross section C-C ☐ of the lip 15 in case 5, ends of the skin layer in the TD are formed thick with a central part thinned due to the influence of the encapsulation phenomenon in the feed block 11. On the other hand, the encapsulation phenomenon is alleviated in case 6 and a fluctuation of the interface in the TD is reduced.

FIGS. 19(a) to 20(b) illustrate a temperature distribution and a pressure distribution of the T-die calculated by the heat flow calculation unit 22. The temperature of case 6 is higher than that of case 5 even after the outlet of the feed block 11. Further, case 6 has a higher pressure than that of case 5 after the outlet of the feed block 11.

FIG. 21 illustrates a flux distribution in the lip 15. The flux obtained by multiplying the layer thickness by the velocity is used for the following comparative studies, because the influence of the flow rate is not expressed when using only the layer thickness. This enables a comparison of the film that has been discharged from the T-die and wound on a winder. As illustrated in FIG. 21(a) a fluctuation range of case 6 is smaller than that of case 5 in the skin layer, and the influence of the encapsulation phenomenon can be suppressed by changing the cross-sectional shape of the junction P. Similarly, as illustrated in FIG. 21(b), a fluctuation range of case 6 is smaller than that of case 5 in the intermediate layer, and the influence of the encapsulation phenomenon can be suppressed. As described above, the multilayer fluid analysis system 1 can easily simulate an influence of encapsulation phenomenon by changing the cross-sectional shape of the junction P in the feed block 11, which is difficult to verify in the actual film casting machine. Note that the multilayer fluid analysis system 1 can perform the analysis in consideration of the viscoelastic effect of the multilayer fluid under various conditions by inputting a predetermined condition into the condition input window 6 and using separately created mesh data of a desired shape.

According to the configuration, since the layer thickness is calculated on the assumption that the layer thickness fluctuates in the TD in each layer, the fluid analysis can be performed based on a phenomenon actually occurring. In particular, the encapsulation phenomenon, in which the fluid having low viscosity encapsulates the fluid having high viscosity in the multilayer fluid having different viscosities, can be expressed in the multilayer fluid analysis. In a conventional 2.5-dimensional analysis, the analysis is performed on the assumption that the fluid to be analyzed is in the developmental state and is the viscous fluid, and the layer thickness in the TD is constant. However, in the present embodiment, the equilibrium equation of stress in the normal direction is calculated by assuming that the fluid is approximately viscoelastic, thereby performing an analysis in which the layer thickness fluctuates in the TD.

Since a polymer such as plastic has a viscoelastic behavior, which has both viscous and elastic properties, a constitutive equation of viscoelasticity may be used for the three-dimensional multilayer fluid analysis. However, the three-dimensional viscoelasticity constitutive equation is considerably complicated and difficult to handle, and requires large amount of calculation. The inventor has achieved in adapting the three-dimensional constitutive equation of viscoelasticity to 2.5 dimensions by using various boundary conditions without considering the flow in the layer thickness direction. In other words, the fluid is not treated as completely viscoelastic in the 2.5-dimensional multilayer fluid analysis and is assumed to be approximately viscoelastic. In this way, analysis contents can be simplified and amount of calculation can be reduced in comparison to the three-dimensional multilayer fluid analysis. Further, various problems occurred in the actual plastic molding can be handled while promptly obtaining output results. In particular, the influence of the flow in the thickness direction is small in a thin multilayer fluid such as a film, so that highly accurate results can be obtained even when the influence of the flow is not taken into consideration.

Further, the layer thickness calculation unit 21 calculates the layer thickness by solving the stress equilibrium equation in the normal direction of Formula 1. Here, the third term of the stress equilibrium equation is not expressed in the conventional 2.5-dimensional analysis, and the third term is expressed by the viscoelasticity constitutive equation of Formula 1. In this way, the equilibrium of the stress in the normal direction is contributed by the second normal stress difference coefficient, which is a physical property value.

The computer readable storage medium storing the multilayer fluid analysis program, the multilayer fluid analysis system, and the multilayer fluid analysis method according to the invention are not limited to the above-described embodiments and various changes can be made within the scope of the gist of the invention described in the claims.

In the above-described embodiment, a multilayer fluid analysis of film processing in the T-die is performed. However, the invention is not limited thereto. When the analysis is a multi-layered viscous fluid analysis, the analysis can be applied to extrusion molding, sheet molding, injection molding, inflation molding, blow molding, press molding, laminating, etc.

What is claimed is:

1. A computer-readable non-transitory storage medium storing a multilayer fluid analysis program for analyzing a multilayer fluid on a feed block type T-die as 2.5 dimensions in which each layer is divided into elements and each of the elements has information about a layer thickness in a finite element model for the multilayer fluid, the multilayer fluid analysis program causing a computer to execute:

a layer thickness calculation process for calculating the layer thickness under a condition that stresses in a normal direction and a tangential direction equilibrate on an interface of each layer and a flow velocity on the interface is continuous, without considering a fluid flow in a thickness direction of the layer thickness, considering a viscoelastic effect of the multilayer fluid to analyze an encapsulation phenomenon in a feed block on a downstream side of a junction of each layer, and based on a shape of a rectangular cross section of the feed block and a second normal stress difference of resin in the feed block assuming that the layer thickness in a transverse direction fluctuates in a developmental state; and a display process for displaying a calculation result of the layer thickness calculation process for each layer in the transverse direction and an machine direction of the multilayer fluid from an upstream side of the junction of each layer to the downstream side of the junction.

2. The computer-readable non-transitory storage medium storing the multilayer fluid analysis program according to claim 1, wherein the layer thickness is calculated in the layer thickness calculation process by solving an equilibrium equation of the stress in the normal direction represented by the following simultaneous equations:

$$-p_l+2\eta_l\dot{\varepsilon}_l+\psi_{2,l}\langle\dot{\gamma}_l^2\rangle = -p_{l+1}+2\eta_{l+1}\dot{\varepsilon}_{l+1}+\psi_{2,l+1}\langle\dot{\gamma}_{l+1}^2\rangle$$
for $l=1\sim n-1$ [Formula 1]

wherein $p_l$ denotes a pressure in each layer, $\eta_l$ denotes a viscosity, $\psi_{2,l}$ denotes a second normal stress difference coefficient, $\varepsilon_l$ denotes a strain rate in the thickness direction, $\gamma_l$ denotes a shear strain rate, and l denotes a layer number, and the Formula 1 is simultaneous differential equations in which layers are simultaneous from a first layer to an lth layer.

3. The computer-readable non-transitory storage medium storing the multilayer fluid analysis program according to claim 1, wherein a pressure gradient in the transverse direction is averaged by a Criminale Erickson Filbey model (CEF model) capable of expressing a viscoelastic surplus stress tensor in the layer thickness calculation process, and the layer thickness is calculated based on the simultaneous differential equations derived using a theoretical solution of the pressure gradient in the machine direction with respect to a flow velocity distribution of a single-layer steady viscous flow in a rectangular cross section.

4. The computer-readable non-transitory storage medium storing a multilayer fluid analysis program according to claim 1, wherein the multilayer fluid analysis program causing the computer to execute a heat flow calculation process for calculating heat flow data of the elements under a condition that stresses in the normal direction and the tangential direction equilibrate on the interface of each layer and the flow velocity on the interface is continuous, without considering the fluid flow in the thickness direction of the layer thickness, considering the viscoelastic effect of the multilayer fluid to analyze an encapsulation phenomenon in the feed block on the downstream side of the junction of each layer, and based on the shape of the rectangular cross section of the feed block and the second normal stress difference of resin in the feed block assuming that the pressure gradient occurs in the cross section orthogonal to the machine direction in the developmental state, wherein the display process displays a calculation result of the heat flow calculation process for each layer in the machine direction and the transverse direction of the multilayer fluid from an upstream side of the junction of each layer to the downstream side of the junction.

5. A multilayer fluid analysis system for analyzing a multilayer fluid on a feed block type T-die as 2.5 dimensions in which each layer is divided into elements and each of the elements has information about a layer thickness in a finite element model for the multilayer fluid, the multilayer fluid analysis system comprising:

a layer thickness calculation unit for calculating the layer thickness under a condition that stresses in a normal direction and a tangential direction equilibrate on an interface of each layer and a flow velocity on the interface is continuous, without considering a fluid flow in a thickness direction of the layer thickness, considering a viscoelastic effect of the multilayer fluid to analyze an encapsulation phenomenon in a feed block on a downstream side of a junction of each layer, and based on a shape of a rectangular cross section of the feed block and a second normal stress difference of resin in the feed block assuming that the layer thickness in a transverse direction fluctuates in a developmental state; and a display unit for displaying a calculation result of the layer thickness calculation unit for each layer in the transverse direction and a machine direction of the multilayer fluid from an upstream side of the junction of each layer to the downstream side of the junction.

6. A multilayer fluid analysis method for analyzing a state change of a multilayer fluid on a feed block type T-die as 2.5 dimensions in which each layer is divided into elements and each of the elements has information about a layer thickness in a finite element model of the multilayer fluid, the multilayer fluid analysis method comprising:

a step of calculating the layer thickness under a condition that stresses in a normal direction and a tangential direction equilibrate on an interface of each layer and a flow velocity on the interface is continuous, without considering a fluid flow in a thickness direction of the layer thickness, considering a viscoelastic effect of the multilayer fluid to analyze an encapsulation phenomenon in a feed block on a downstream side of a junction of each layer, and based on a shape of a rectangular cross section of the feed block and a second normal stress difference of resin in the feed block assuming that the layer thickness in a transverse direction fluctuates in a developmental state; and a step of displaying a calculation result of the step of calculating the layer thickness for each layer in the transverse direction and a machine direction of the multilayer fluid from an upstream side of the junction of each layer to the downstream side of the junction.

\* \* \* \* \*